US009064466B2

(12) United States Patent
Lin et al.

(10) Patent No.: US 9,064,466 B2
(45) Date of Patent: Jun. 23, 2015

(54) LIQUID CRYSTAL DISPLAY AND SHIFT REGISTER DEVICE THEREOF

(71) Applicant: Hannstar Display Corporation, New Taipei (TW)

(72) Inventors: Wen-Zhe Lin, Tainan (TW); Chun-Chin Tseng, Kaohsiung (TW); Ya-Wen Lee, Tainan (TW); Chien-Chuan Ko, Changhua County (TW); Hsin-Han Tsai, Kaohsiung (TW)

(73) Assignee: HannStar Display Corporation, Taipei (TW)

( * ) Notice: Subject to any disclaimer, the term of this patent is extended or adjusted under 35 U.S.C. 154(b) by 184 days.

(21) Appl. No.: 13/854,141

(22) Filed: Apr. 1, 2013

(65) Prior Publication Data
US 2014/0055333 A1    Feb. 27, 2014

(30) Foreign Application Priority Data
Aug. 22, 2012    (CN) .......................... 2012 1 0301090

(51) Int. Cl.
G09G 3/36 (2006.01)
G11C 19/28 (2006.01)

(52) U.S. Cl.
CPC ............ *G09G 3/3611* (2013.01); *G09G 3/3677* (2013.01); *G09G 2310/0286* (2013.01); *G11C 19/28* (2013.01)

(58) Field of Classification Search
CPC .................. G11C 19/28; G09G 3/3677; G09G 2310/0283; G09G 2310/0286; G09G 3/3611
USPC ................ 345/98, 100, 204, 102; 377/64, 69; 362/97.1–97.3
See application file for complete search history.

(56) References Cited

U.S. PATENT DOCUMENTS

| 7,106,292 | B2 * | 9/2006 | Moon ......................... 345/100 |
| 7,636,412 | B2 * | 12/2009 | Tobita ............................ 377/64 |
| 7,738,622 | B2 * | 6/2010 | Cho et al. ...................... 377/64 |
| 7,792,237 | B2 * | 9/2010 | Chen et al. .................... 377/64 |
| 7,859,507 | B2 * | 12/2010 | Jang et al. .................... 345/100 |
| 8,014,488 | B2 * | 9/2011 | Jang ............................... 377/64 |
| 8,159,446 | B2 * | 4/2012 | Lee et al. ..................... 345/100 |
| 8,253,680 | B2 * | 8/2012 | Jang et al. .................... 345/100 |
| 8,344,989 | B2 * | 1/2013 | Kim .............................. 345/100 |
| 8,477,094 | B2 * | 7/2013 | Jung et al. .................... 345/100 |
| 8,519,935 | B2 * | 8/2013 | Chen et al. .................... 345/100 |
| 8,730,144 | B2 * | 5/2014 | Lee et al. ..................... 345/100 |
| 8,836,633 | B2 * | 9/2014 | Tsai et al. .................... 345/100 |
| 8,866,724 | B2 * | 10/2014 | Moon ........................... 345/100 |
| 8,878,765 | B2 * | 11/2014 | Shin et al. .................... 345/100 |
| 2003/0227433 | A1 * | 12/2003 | Moon ........................... 345/100 |
| 2006/0256066 | A1 * | 11/2006 | Moon ........................... 345/100 |

(Continued)

*Primary Examiner* — Lun-Yi Lao
*Assistant Examiner* — Peter D McLoone
(74) *Attorney, Agent, or Firm* — Jianq Chyun IP Office

(57) ABSTRACT

A liquid crystal display (LCD) and a shift register device thereof are disclosed. The shift register device includes a plurality of serially connected shift registers for sequentially generating a plurality of scan signals. Each of the shift registers generates one of the scan signals according to a predetermined activating signal and a plurality of clock signals. The shift registers are categorized into a first group, a second group, and a third group. The first group of shift registers and the second group of shift registers have different circuit structures. The second group of shift registers and the third group of shift registers have different circuit structures. The first group of shift registers and the third group of shift registers have different circuit structures.

19 Claims, 12 Drawing Sheets

(56) References Cited

U.S. PATENT DOCUMENTS

| | | | |
|---|---|---|---|
| 2007/0001991 A1* | 1/2007 | Jang et al. | 345/100 |
| 2007/0248204 A1* | 10/2007 | Tobita | 377/64 |
| 2007/0297559 A1* | 12/2007 | Cho et al. | 377/64 |
| 2008/0224985 A1* | 9/2008 | Jang | 345/100 |
| 2008/0266477 A1* | 10/2008 | Lee et al. | 349/46 |
| 2009/0167668 A1* | 7/2009 | Kim | 345/100 |
| 2009/0175405 A1* | 7/2009 | Chen et al. | 377/68 |
| 2009/0256794 A1* | 10/2009 | Jang et al. | 345/100 |
| 2011/0157124 A1* | 6/2011 | Jung et al. | 345/211 |
| 2011/0273417 A1* | 11/2011 | Shin et al. | 345/211 |
| 2011/0316834 A1* | 12/2011 | Lee et al. | 345/211 |
| 2012/0075275 A1* | 3/2012 | Chen et al. | 345/208 |
| 2012/0105398 A1* | 5/2012 | Park et al. | 345/206 |
| 2012/0162187 A1* | 6/2012 | Lee et al. | 345/212 |
| 2012/0188211 A1* | 7/2012 | Tsai et al. | 345/205 |
| 2012/0293467 A1* | 11/2012 | Lee et al. | 345/204 |
| 2013/0169609 A1* | 7/2013 | Son et al. | 345/209 |
| 2014/0049712 A1* | 2/2014 | Yu et al. | 349/34 |
| 2014/0118237 A1* | 5/2014 | Wang | 345/100 |
| 2014/0168044 A1* | 6/2014 | HU et al. | 345/90 |
| 2014/0320386 A1* | 10/2014 | Li et al. | 345/87 |
| 2014/0320466 A1* | 10/2014 | Son | 345/204 |

* cited by examiner

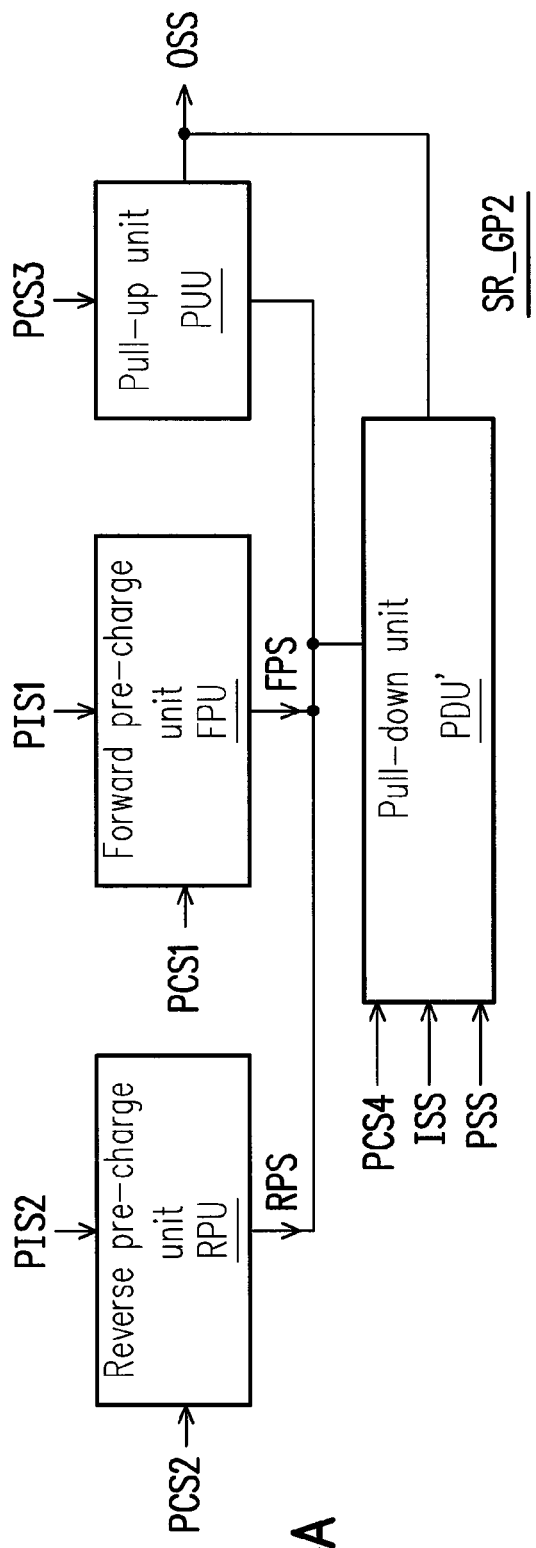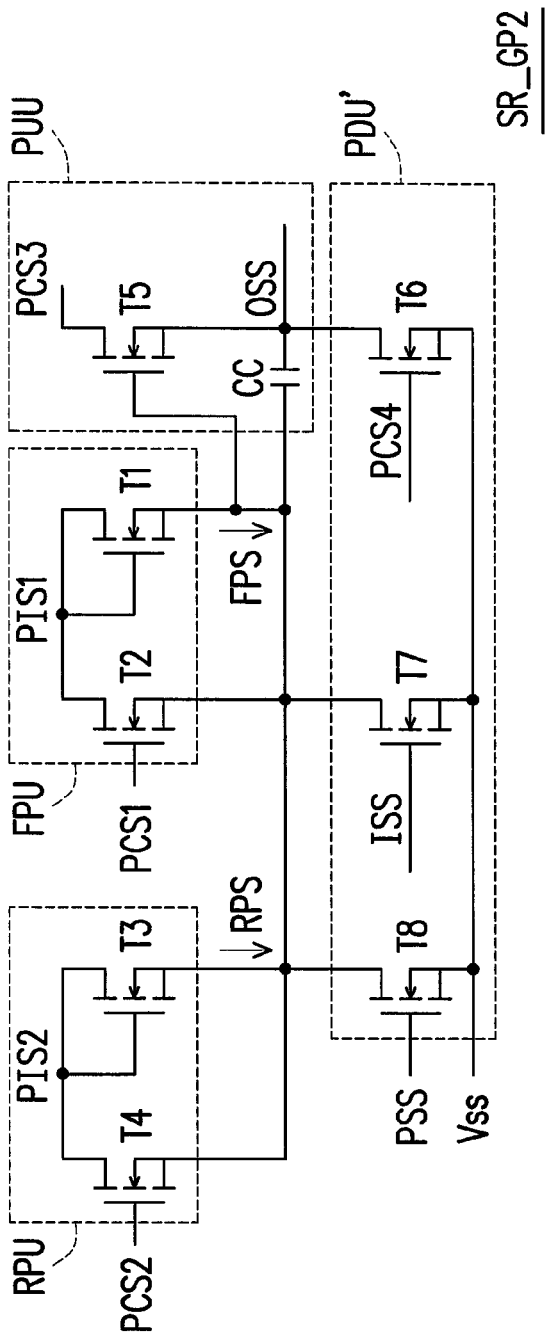
FIG. 4A
FIG. 4B

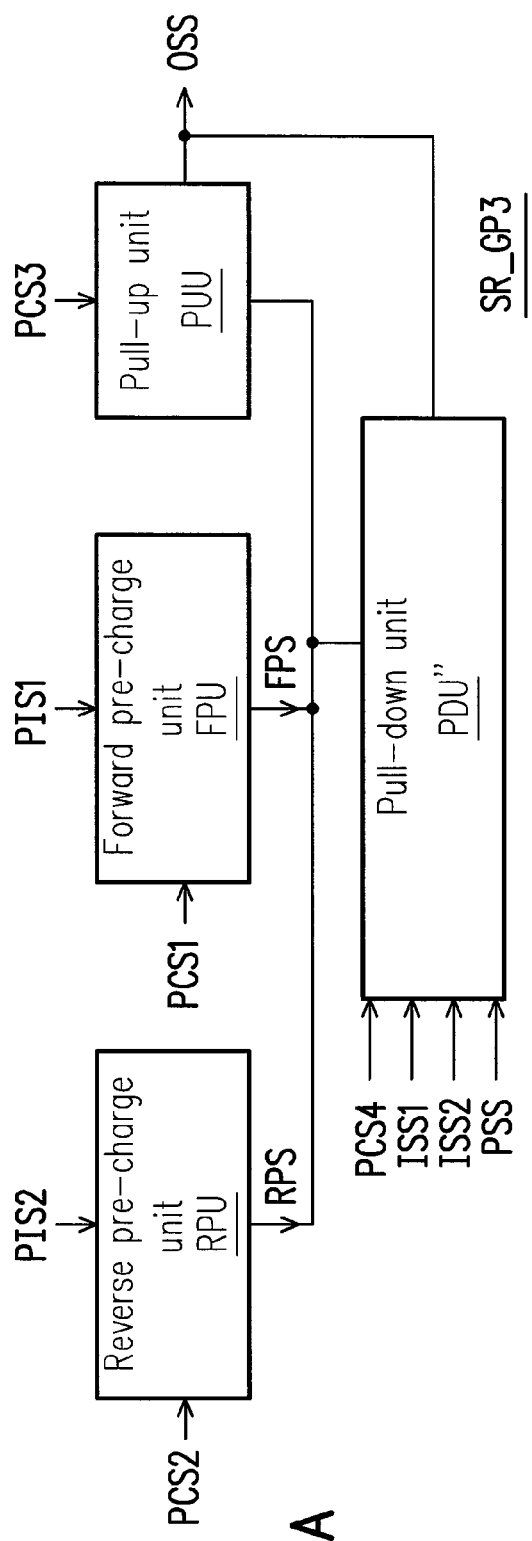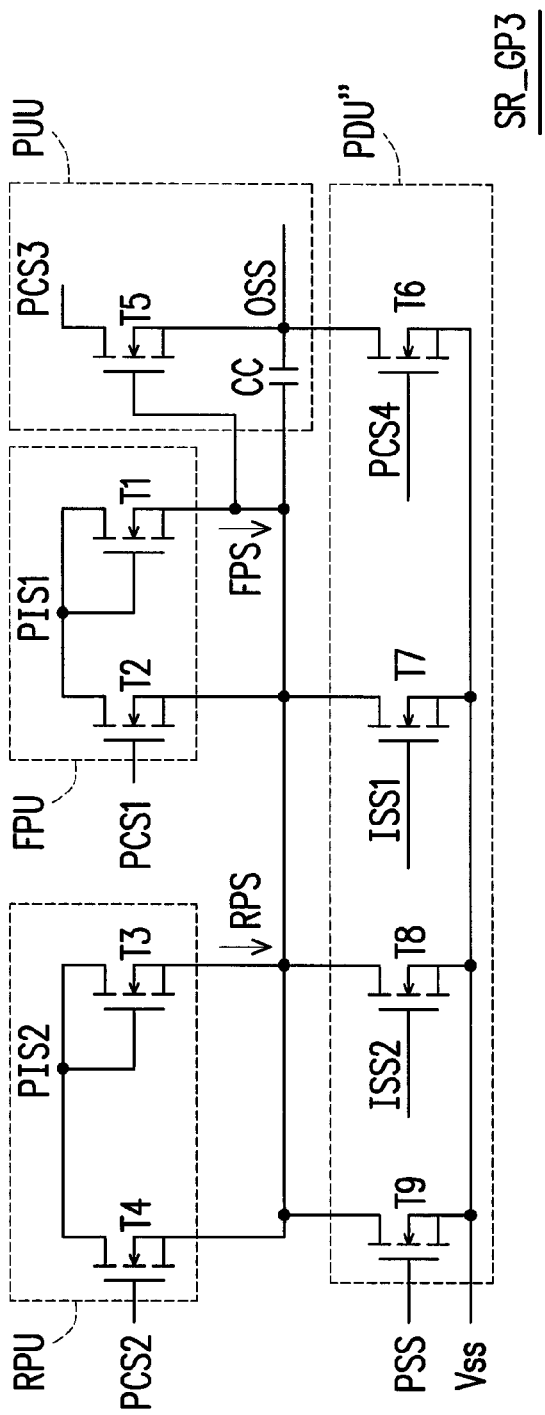
FIG. 5A
FIG. 5B ics of the invention.

LIQUID CRYSTAL DISPLAY AND SHIFT REGISTER DEVICE THEREOF

CROSS-REFERENCE TO RELATED APPLICATION

This application claims the priority benefit of China application serial no. 201210301090.9, filed on Aug. 22, 2012. The entirety of the above-mentioned patent application is hereby incorporated by reference herein and made a part of this specification.

BACKGROUND OF THE INVENTION

1. Field of the Invention

The invention generally relates to a flat panel display technique, and more particularly, to a liquid crystal display (LCD) and a shift register device thereof.

2. Description of Related Art

In recent years, portable electronic products and flat panel displays have been broadly adopted along with the rapid advancement of semiconductor technologies. Among all flat panel displays, liquid crystal display (LCD) has become the mainstream display product due to such characteristics thereof as low power consumption, no radiation, light weight, and small volume. Thus, nowadays, many manufacturers focus on the development of small-sized and low-cost LCDs.

To reduce the fabrication cost of LCD, in an LCD panel fabricated through the amorphous silicon (a-Si) process, the shift register in the scan driving integrated circuit (IC) is removed from the scan side of the LCD panel and is directly disposed on the glass substrate of the LCD panel instead. Thus, the scan driving IC originally disposed at the scan side of the LCD panel can be omitted and accordingly the fabrication cost of the LCD can be reduced.

SUMMARY OF THE INVENTION

Accordingly, the invention is directed to a liquid crystal display (LCD) and a shift register device thereof. The shift register device includes three groups of shift registers having different circuit structures and can accomplish the forward scanning and reverse scanning functions with appropriate operating signals.

The invention provides a shift register device including a plurality of serially connected shift registers. The shift registers sequentially generate a plurality of scan signals. Each of the shift registers generates one of the scan signals according to a predetermined activating signal and a plurality of clock signals. The shift registers are categorized into a first group, a second group, and a third group. The first group of shift registers and the second group of shift registers have different circuit structures, the second group of shift registers and the third group of shift registers have different circuit structures, and the first group of shift registers and the third group of shift registers have different circuit structures.

The invention provides an LCD including an LCD panel and a backlight module. The LCD panel includes a substrate and the aforementioned shift register device directly disposed on the substrate. The backlight module provides a backlight source for the LCD panel.

According to an exemplary embodiment of the invention, the predetermined activating signal includes a first activating signal or a second activating signal. The clock signals include a first clock signal, a second clock signal, a third clock signal, and a fourth clock signal. The sequentially generated scan signals at least include a first dummy scan signal, a second dummy scan signal, a first scan driving signal, a second scan driving signal, a third scan driving signal, a fourth scan driving signal, a third dummy scan signal, and a fourth dummy scan signal. Each of the shift registers in the first group includes a forward pre-charge unit, a reverse pre-charge unit, a pull-up unit, and a pull-down unit. The forward pre-charge unit receives a first predetermined input signal and a first predetermined clock signal and generates a forward pre-charge signal according to the first predetermined input signal and the first predetermined clock signal. The reverse pre-charge unit is coupled to the forward pre-charge unit. The reverse pre-charge unit receives a second predetermined input signal and a second predetermined clock signal and generates a reverse pre-charge signal according to the second predetermined input signal and the second predetermined clock signal. The pull-up unit is coupled to the forward pre-charge unit and the reverse pre-charge unit. The pull-up unit receives a third predetermined clock signal and the forward or reverse pre-charge signal and generates an output scan signal according to the third predetermined clock signal and the forward or reverse pre-charge signal. The pull-down unit is coupled to the forward pre-charge unit, the reverse pre-charge unit, and the pull-up unit. The pull-down unit receives a fourth predetermined clock signal and an input scan signal and determines whether to pull down the output scan signal to a reference potential according to the fourth predetermined clock signal and the input scan signal.

According to an exemplary embodiment of the invention, the forward pre-charge unit includes a first transistor and a second transistor. The drain and the gate of the first transistor are coupled together for receiving the first predetermined input signal. The gate of the second transistor receives the first predetermined clock signal, the drain of the second transistor is coupled to the drain of the first transistor, and the source of the second transistor is coupled to the source of the first transistor. The reverse pre-charge unit includes a third transistor and a fourth transistor. The drain and the gate of the third transistor are coupled together for receiving the second predetermined input signal, and the source of the third transistor is coupled to the source of the second transistor. The gate of the fourth transistor receives the second predetermined clock signal, the drain of the fourth transistor is coupled to the drain of the third transistor, and the source of the fourth transistor is coupled to the source of the third transistor. The pull-up unit includes a fifth transistor and a capacitor. The gate of the fifth transistor is coupled to the source of the first transistor, the drain of the fifth transistor receives the third predetermined clock signal, and the source of the fifth transistor outputs the output scan signal. The capacitor is coupled between the gate and the source of the fifth transistor. The pull-down unit includes a sixth transistor and a seventh transistor. The gate of the sixth transistor receives the fourth predetermined clock signal, the drain of the sixth transistor is coupled to the source of the fifth transistor, and the source of the sixth transistor is coupled to the reference potential. The gate of the seventh transistor receives the input scan signal, the drain of the seventh transistor is coupled to the source of the first transistor, and the source of the seventh transistor is coupled to the source of the sixth transistor.

According to an exemplary embodiment of the invention, the predetermined activating signal includes a first activating signal or a second activating signal. The clock signals include a first clock signal, a second clock signal, a third clock signal, and a fourth clock signal. The sequentially generated scan signals at least include a first dummy scan signal, a second dummy scan signal, a first scan driving signal, a second scan driving signal, a third scan driving signal, a fourth scan driving signal, a third dummy scan signal, and a fourth dummy scan signal. Each of the shift registers in the second group includes a forward pre-charge unit, a reverse pre-charge unit, a pull-up unit, and a pull-down unit. The forward pre-charge unit receives a first predetermined input signal and a first predetermined clock signal and generates a forward pre-charge signal according to the first predetermined input signal and the first predetermined clock signal. The reverse pre-charge unit is coupled to the forward pre-charge unit. The reverse pre-charge unit receives a second predetermined input signal and a second predetermined clock signal and generates a reverse pre-charge signal according to the second predetermined input signal and the second predetermined clock signal. The pull-up unit is coupled to the forward pre-charge unit and the reverse pre-charge unit. The pull-up unit receives a third predetermined clock signal and the forward or reverse pre-charge signal and generates an output scan signal according to the third predetermined clock signal and the forward or reverse pre-charge signal. The pull-down unit is coupled to the forward pre-charge unit, the reverse pre-charge unit, and the pull-up unit. The pull-down unit receives a fourth predetermined clock signal, an input scan signal, and a predetermined activating signal and determines whether to pull down the output scan signal to a reference potential according to the fourth predetermined clock signal, the input scan signal, and the predetermined activating signal.

According to an exemplary embodiment of the invention, the forward pre-charge unit includes a first transistor and a second transistor. The drain and the gate of the first transistor are coupled together for receiving the first predetermined input signal. The gate of the second transistor receives the first predetermined clock signal, the drain of the second transistor is coupled to the drain of the first transistor, and the source of the second transistor is coupled to the source of the first transistor. The reverse pre-charge unit includes a third transistor and a fourth transistor. The drain and the gate of the third transistor are coupled together for receiving the second predetermined input signal, and the source of the third transistor is coupled to the source of the second transistor. The gate of the fourth transistor receives the second predetermined clock signal, the drain of the fourth transistor is coupled to the drain of the third transistor, and the source of the fourth transistor is coupled to the source of the third transistor. The pull-up unit includes a fifth transistor and a capacitor. The gate of the fifth transistor is coupled to the source of the first transistor, the drain of the fifth transistor receives the third predetermined clock signal, and the source of the fifth transistor outputs the output scan signal. The capacitor is coupled between the gate and the source of the fifth transistor. The pull-down unit includes a sixth transistor, a seventh transistor, and an eighth transistor. The gate of the sixth transistor receives the fourth predetermined clock signal, the drain of the sixth transistor is coupled to the source of the fifth transistor, and the source of the sixth transistor is coupled to the reference potential. The gate of the seventh transistor receives the input scan signal, the drain of the seventh transistor is coupled to the source of the first transistor, and the source of the seventh transistor is coupled to the source of the sixth transistor. The gate of the eighth transistor receives a predetermined activating signal, the drain of the eighth transistor is coupled to the source of the first transistor, and the source of the eighth transistor is coupled to the source of the sixth transistor.

According to an exemplary embodiment of the invention, the predetermined activating signal includes a first activating signal or a second activating signal. The clock signals include a first clock signal, a second clock signal, a third clock signal, and a fourth clock signal. The sequentially generated scan signals at least include a first dummy scan signal, a second dummy scan signal, a first scan driving signal, a second scan driving signal, a third scan driving signal, a fourth scan driving signal, a third dummy scan signal, and a fourth dummy scan signal. Each of the shift registers in the third group includes a forward pre-charge unit, a reverse pre-charge unit, a pull-up unit, and a pull-down unit. The forward pre-charge unit receives a first predetermined input signal and a first predetermined clock signal and generates a forward pre-charge signal according to the first predetermined input signal and the first predetermined clock signal. The reverse pre-charge unit is coupled to the forward pre-charge unit. The reverse pre-charge unit receives a second predetermined input signal and a second predetermined clock signal and generates a reverse pre-charge signal according to the second predetermined input signal and the second predetermined clock signal. The pull-up unit is coupled to the forward pre-charge unit and the reverse pre-charge unit. The pull-up unit receives a third predetermined clock signal and the forward or reverse pre-charge signal and generates an output scan signal according to the third predetermined clock signal and the forward or reverse pre-charge signal. The pull-down unit is coupled to the forward pre-charge unit, the reverse pre-charge unit, and the pull-up unit. The pull-down unit receives a fourth predetermined clock signal, a first input scan signal, a second input scan signal, and a predetermined activating signal and determines whether to pull down the output scan signal to a reference potential according to the fourth predetermined clock signal, the first input scan signal, the second input scan signal, and the predetermined activating signal.

According to an exemplary embodiment of the invention, the forward pre-charge unit includes a first transistor and a second transistor. The drain and the gate of the first transistor are coupled together for receiving the first predetermined input signal. The gate of the second transistor receives the first predetermined clock signal, the drain of the second transistor is coupled to the drain of the first transistor, and the source of the second transistor is coupled to the source of the first transistor. The reverse pre-charge unit includes a third transistor and a fourth transistor. The drain and the gate of the third transistor are coupled together for receiving the second predetermined input signal, and the source of the third transistor is coupled to the source of the second transistor. The gate of the fourth transistor receive the second predetermined clock signal, the drain of the fourth transistor is coupled to the drain of the third transistor, and the source of the fourth transistor is coupled to the source of the third transistor. The pull-up unit includes a fifth transistor and a capacitor. The gate of the fifth transistor is coupled to the source of the first transistor, the drain of the fifth transistor receives the third predetermined clock signal, and the source of the fifth transistor outputs the output scan signal. The capacitor is coupled between the gate and the source of the fifth transistor. The pull-down unit includes a sixth transistor, a seventh transistor, an eighth transistor, and a ninth transistor. The gate of the sixth transistor receive the fourth predetermined clock signal, the drain of the sixth transistor is coupled to the source of the fifth transistor, and the source of the sixth transistor is coupled to the reference potential. The gate of the seventh transistor receive the first input scan signal, the drain of the seventh transistor is coupled to the source of the first transistor, and the source of the seventh transistor is coupled to the source of the sixth transistor. The gate of the eighth transistor receive the second input scan signal, the drain of the seventh transistor is coupled to the source of the first transistor, and the source of the seventh transistor is coupled to the source of the sixth transistor. The gate of the ninth transistor receives the predetermined activating signal, the drain of the ninth transistor is coupled to the source of the first transistor, and the source of the ninth transistor is coupled to the source of the sixth transistor.

As described above, the invention provides an LCD and a shift register device thereof. The shift register device has three groups of shift registers. Thus, by applying appropriate activating signals and clock signals, a forward scanning (i.e., the pixels are sequentially activated from the first row to the last row) pixel activation mode and a reverse scanning (i.e., the pixels are sequentially activated from the last row to the first row) pixel activation mode can be respectively realized when the pixels in the display area of the LCD are activated.

These and other exemplary embodiments, features, aspects, and advantages of the invention will be described and become more apparent from the detailed description of exemplary embodiments when read in conjunction with accompanying drawings.

However, it should be understood that foregoing general descriptions and following embodiments are exemplary but not intended to limit the scope of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4A is a diagram of a shift register in a second group in FIG. 2.

FIG. 4B is a diagram illustrating the circuit structure of the shift register in the second group according to the embodiment illustrated in FIG. 4A.

FIG. 5A is a diagram of a shift register in a third group in FIG. 2.

FIG. 5B is a diagram illustrating the circuit structure of the shift register in the third group according to the embodiment illustrated in FIG. 5A.

DESCRIPTION OF THE EMBODIMENTS

Figure 1:
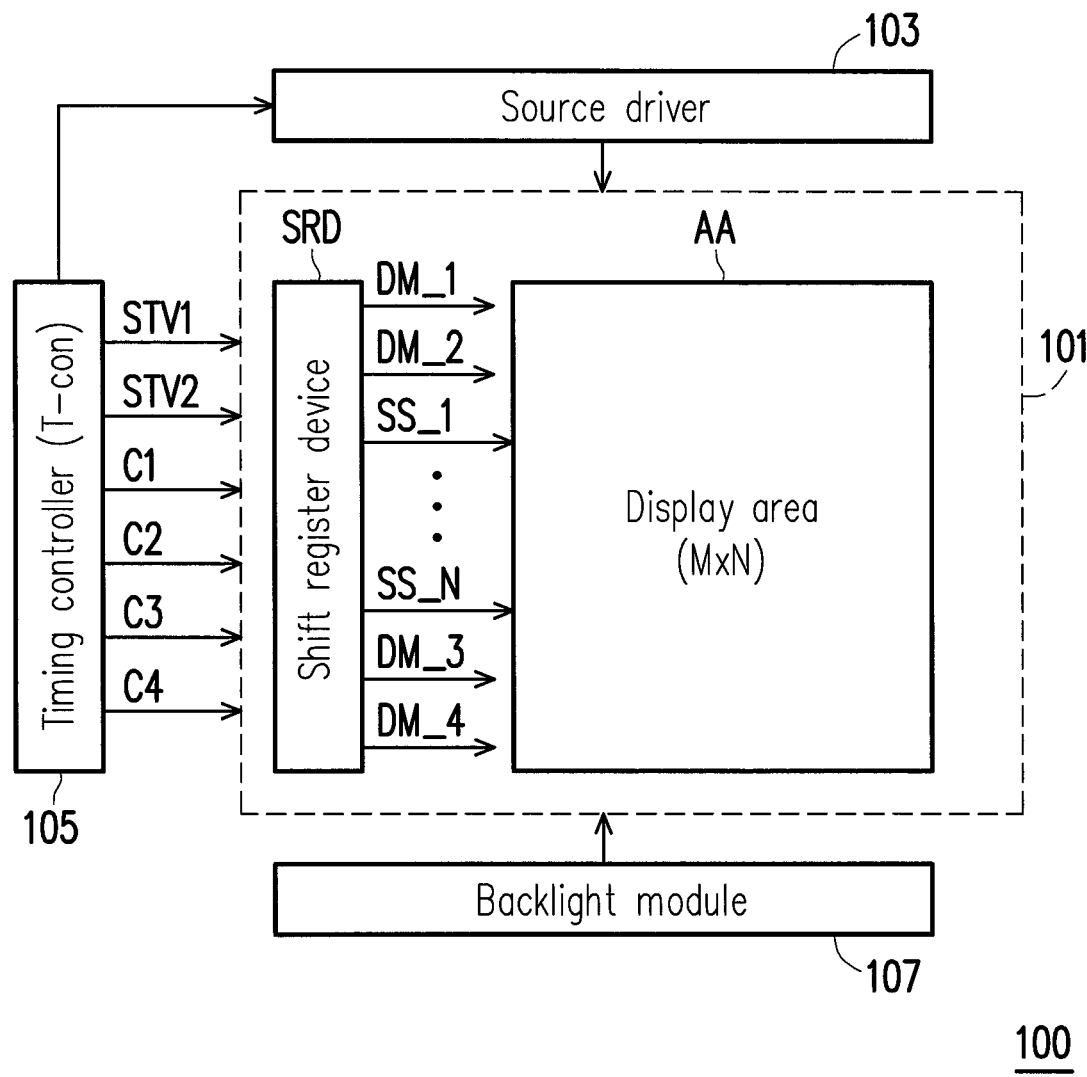
FIG. 1 is a system block diagram of a liquid crystal display (LCD) according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a system block diagram of a liquid crystal display (LCD) according to an exemplary embodiment of the invention. Referring to FIG. 1, the LCD 100 includes an LCD panel 101, a source driver 103, a timing controller (T-con) 105, and a backlight module 107. The backlight module 107 provides a (back)light source for the LCD panel 101.

In the present exemplary embodiment, a plurality of pixels arranged into an array (denoted as M×N in FIG. 1, wherein M and N are both positive integers) is located within the display area AA of the LCD panel 101. Besides, a shift register device SRD is directly disposed on one side (or both sides) of a substrate (not shown, may be a glass substrate) of the LCD panel 101. The shift register device SRD is controlled by the T-con 105 and performs forward scanning from top to bottom or reverse scanning from bottom to top on all the row pixels within the display area AA in response to activating signals STV1 and STV2 and clock signals C1-C4 provided by the T-con 105. Obviously, the shift register device SRD is a bi-directional shift register device.

In other words, the shift register device SRD can forward (i.e., from top to bottom) and sequentially output dummy scan signals (DM_1, DM_2), scan driving signals SS_1-SS_N, and dummy scan signals (DM_3, DM_4) in response to the activating signals STV1 and STV2 and the clock signals C1-C4 provided by the T-con 105, so as to sequentially activate the pixels within the display area AA from the first row to the last row through the scan signals SS_1-SS_N. Or, the shift register device SRD can reversely (i.e., from bottom to top) and sequentially output dummy scan signals (DM_4, DM_3), scan driving signals SS_N-SS_1, and dummy scan signals (DM_2, DM_1) in response to the activating signals STV1 and STV2 and the clock signals C1-C4 provided by the T-con 105, so as to sequentially activate the pixels within the display area AA from the last row to the first row through the scan signals SS_N-SS_1.

It should be mentioned herein that none of the dummy scan signals (DM_1-DM_4) is used for activating any row pixel within the display area AA. Instead, the dummy scan signals (DM_1-DM_4) are simply outputted to allow the shift register device SRD to work properly.

Figure 2:
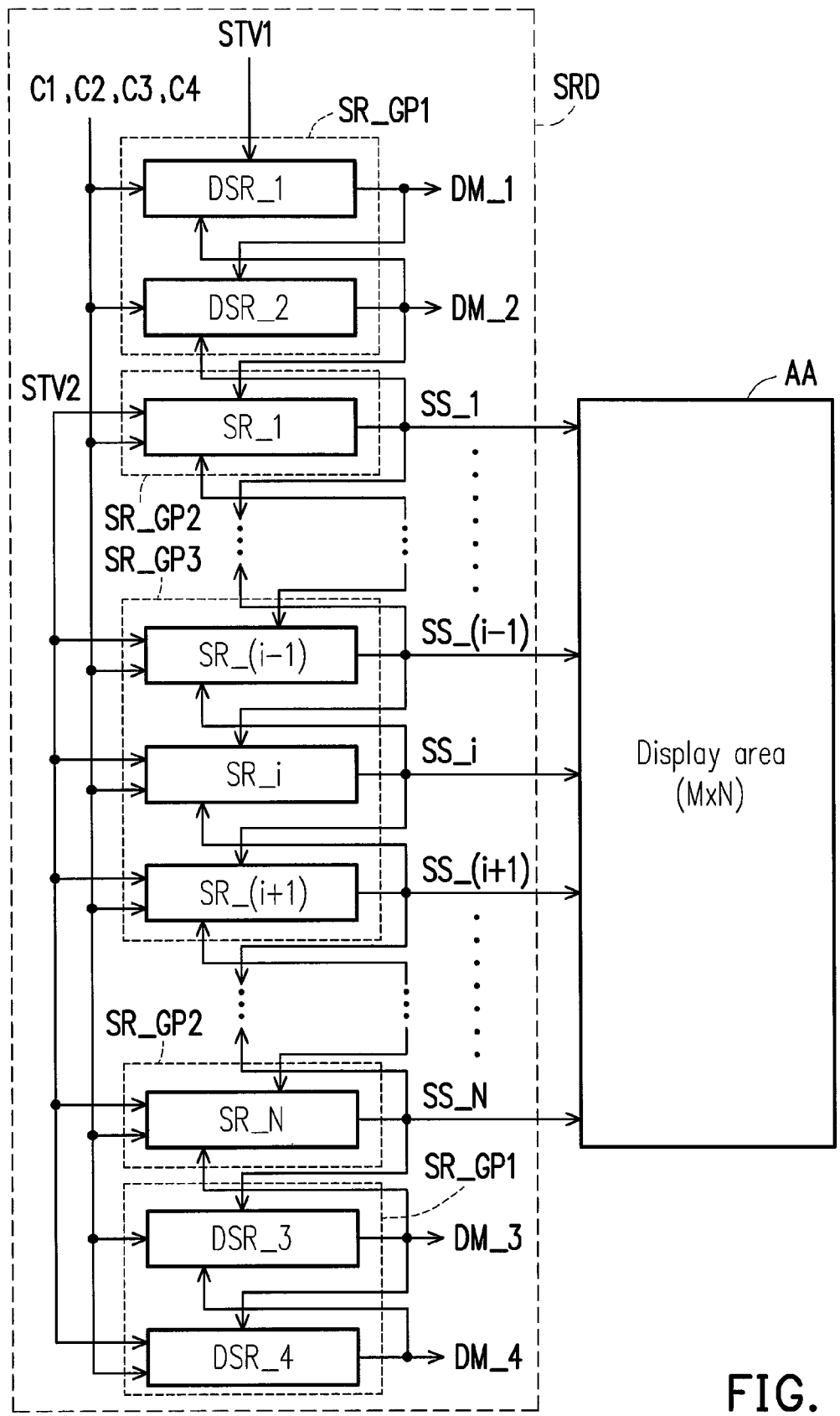
FIG. 2 is a block diagram of a shift register device in FIG. 1.

FIG. 2 is a block diagram of the shift register device in FIG. 1. Referring to both FIG. 1 and FIG. 2, the shift register device SRD includes (N+4) serially connected shift registers (SR_1-SR_N, DSR_1-DSR_4). The shift registers (SR_1-SR_N, DSR_1-DSR_4) sequentially generate a plurality of scan signals (for example, forwardly and sequentially generate the dummy scan signals (DM_1, DM_2), the scan driving signals SS_1-SS_N, and the dummy scan signals (DM_3, DM_4) or reversely and sequentially generate the dummy scan signals (DM_4, DM_3), the scan driving signals SS_N-SS_1, and the dummy scan signals (DM_2, DM_1)) in response to the activating signals STV1 and STV2 and the clock signals C1-C4 provided by the T-con 105.

In the present exemplary embodiment, the shift registers SR_1-SR_N and DSR_1-DSR_4 can be substantially categorized into a first group SR_GP1, a second group SR_GP2, and a third group SR_GP3. The first group SR_GP1 may include the shift registers DSR_1-DSR_4, the second group SR_GP2 may include the shift registers SR_1 and SRN, and the third group SR_GP3 may include the shift registers SR_2-SR(N–1). It should be noted that shift registers belonging to different groups have different circuit structures.

Figure 3A:
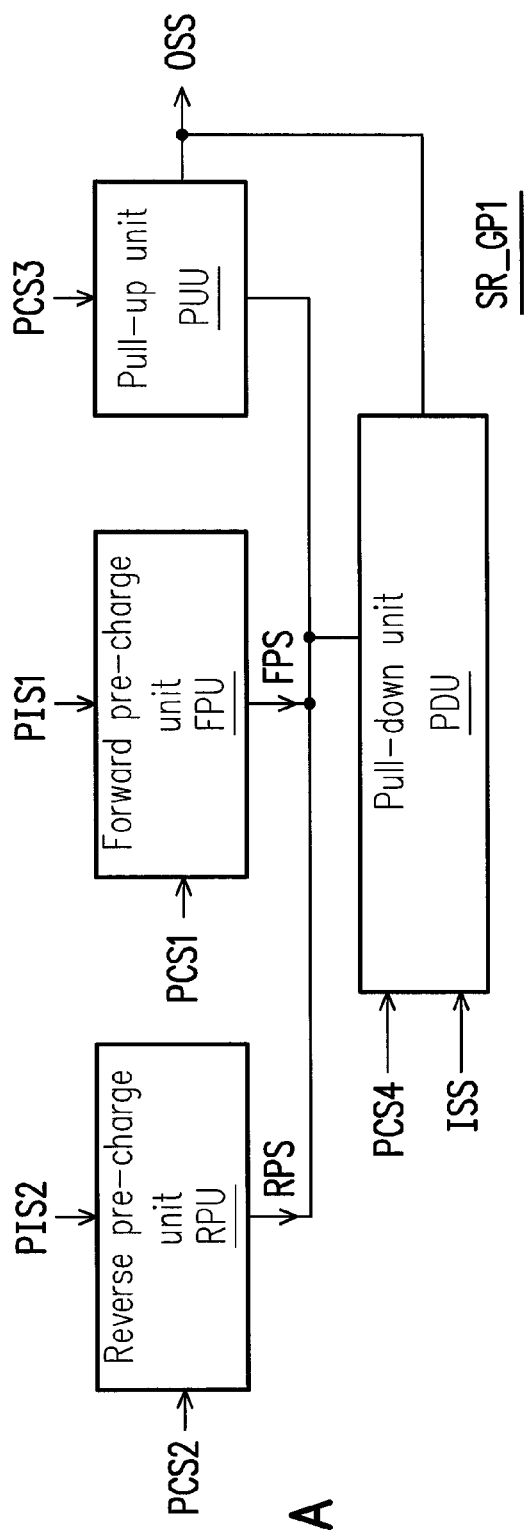
FIG. 3A is a diagram of a shift register in a first group in FIG. 2.

FIG. 3A is a diagram of a shift register in the first group in FIG. 2. Referring to FIG. 3A, each of the shift registers DSR_1-DSR_4 in the first group SR_GP1 includes a forward pre-charge unit FPU, a reverse pre-charge unit RPU, a pull-up unit PUU, and a pull-down unit PDU. The forward pre-charge unit FPU receives a first predetermined input signal PIS1 and a first predetermined clock signal PCS1 and generates a forward pre-charge signal FPS accordingly. The reverse pre-charge unit RPU is coupled to the forward pre-charge unit FPU. The reverse pre-charge unit RPU receives a second predetermined input signal PIS2 and a second predetermined clock signal PCS2 and generates a reverse pre-charge signal RPS accordingly.

The pull-up unit PUU is coupled to the forward pre-charge unit FPU and the reverse pre-charge unit RPU. The pull-up unit PUU receives a third predetermined clock signal PCS3 and the forward pre-charge signal FPS or the third predetermined clock signal PCS3 and the reverse pre-charge signal RPS and generates an output scan signal OSS accordingly. The pull-down unit PDU is coupled to the forward pre-charge unit FPU, the reverse pre-charge unit RPU, and the pull-up unit PUU. The pull-down unit PDU receives a fourth predetermined clock signal PCS4 and an input scan signal ISS and determines whether to pull down the output scan signal OSS to a reference potential (for example, a negative voltage, but not limited thereto) accordingly.

Figure 3B:
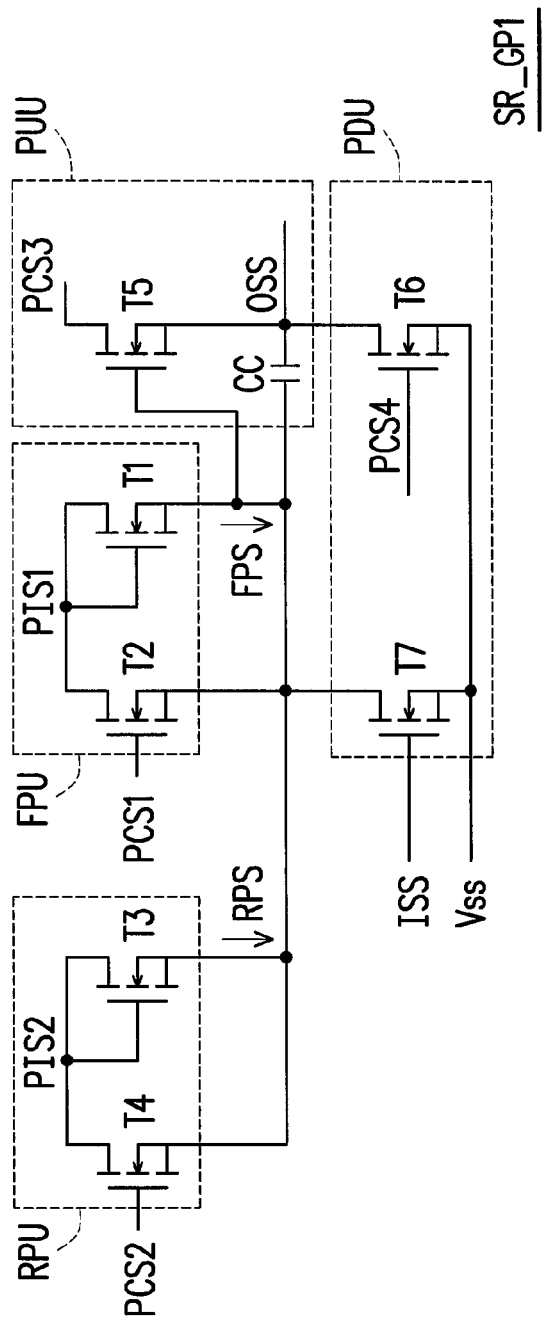
FIG. 3B is a diagram illustrating the circuit structure of the shift register in the first group according to the embodiment illustrated in FIG. 3A.

FIG. 3B is a diagram illustrating the circuit structure of the shift register in the first group according to the embodiment illustrated in FIG. 3A. All transistors mentioned in following embodiments are N-type transistors. However, the invention is not limited thereto. Referring to both FIG. 3A and FIG. 3B, in each of the shift registers DSR_1-DSR_4 in the first group SR_GP1, the forward pre-charge unit FPU includes a first transistor T1 and a second transistor T2. The drain and the gate of the first transistor T1 are coupled together for receiving the first predetermined input signal PIS 1. The gate of the second transistor T2 receives the first predetermined clock signal PCS1, the drain of the second transistor T2 is coupled to the drain of the first transistor T1, and the source of the second transistor T2 is coupled to the source of the first transistor T1.

The reverse pre-charge unit RPU includes a third transistor T3 and a fourth transistor T4. The drain and the gate of the third transistor T3 are coupled together for receiving the second predetermined input signal PIS2, and the source of the third transistor T3 is coupled to the source of the second transistor T2. The gate of the fourth transistor T4 receives the second predetermined clock signal PCS2, the drain of the fourth transistor T4 is coupled to the drain of the third transistor T3, and the source of the fourth transistor T4 is coupled to the source of the third transistor T3.

The pull-up unit PUU includes a fifth transistor T5 and a capacitor CC. The gate of the fifth transistor T5 is coupled to the source of the first transistor T1, the drain of the fifth transistor T5 receives the third predetermined clock signal PCS3, and the source of the fifth transistor T5 outputs the output scan signal OSS. The capacitor CC is coupled between the gate and the source of the fifth transistor T5.

The pull-down unit PDU includes a sixth transistor T6 and a seventh transistor T7. The gate of the sixth transistor T6 receives the fourth predetermined clock signal PCS4, the drain of the sixth transistor T6 is coupled to the source of the fifth transistor T5, and the source of the sixth transistor T6 is coupled to a reference potential Vss. The gate of the seventh transistor T7 receives the input scan signal ISS, the drain of the seventh transistor T7 is coupled to the source of the first transistor T1, and the source of the seventh transistor T7 is coupled to the source of the sixth transistor T6.

FIG. 4A is a diagram of a shift register in the second group in FIG. 2. Referring to FIG. 4A, the structure of shift register in the second group SR_GP2 is similar to that of the shift register in the first group SR_GP1 illustrated in 3A, and the difference is that in the second group SR_GP2, the pull-down unit PDU' further receives a predetermined activating signal PSS besides the fourth predetermined clock signal PCS4 and the input scan signal ISS.

FIG. 4B is a diagram illustrating the circuit structure of the shift register in the second group according to the embodiment illustrated in FIG. 4A. Referring to both FIG. 4A and FIG. 4B, in the shift registers SR_1 and SRN of the second group SR_GP2, the forward pre-charge unit FPU, the reverse pre-charge unit RPU, and the pull-up unit PUU have the same circuit elements and receive the same signals as those illustrated in FIG. 3B therefore will not be described herein. Corresponding to the predetermined activating signal PSS received by the pull-down unit PDU' (as shown in FIG. 4A), the circuit structure of the pull-down unit PDU' further includes an eighth transistor T8 compared to that of the pull-down unit PDU in FIG. 3B. The gate of the eighth transistor T8 receives the predetermined activating signal PSS, the drain of the eighth transistor T8 is coupled to the source of the first transistor T1, and the source of the eighth transistor T8 is coupled to the source of the sixth transistor T6.

FIG. 5A is a diagram of a shift register in the third group in FIG. 2. Referring to FIG. 5A, the structure of each shift register in the third group SR_GP3 is similar to that of each shift register in the first group SR_GP1 illustrated in FIG. 3A, and the only difference is that in the third group SR_GP3, the pull-down unit PDU" receives the fourth predetermined clock signal PCS4, the first input scan signal ISS1, the second input scan signal ISS2, and the predetermined activating signal PSS.

FIG. 5B is a diagram illustrating the circuit structure of the shift register in the third group according to the embodiment illustrated in FIG. 5A. Referring to both FIG. 5A and FIG. 5B, in the shift registers SR_2-SR_(N−1) of the third group SR_GP3, the forward pre-charge unit FPU, the reverse pre-charge unit RPU, and the pull-up unit PUU have the same circuit elements and receive the same signals as those illustrated in FIG. 3B therefore will not be described herein. The only difference between the shift registers in the third group SR_GP3 and the shift registers in the first group SR_GP1 falls on the circuit structures of the pull-down unit PDU" and the pull-down unit PDU.

To be specific, the pull-down unit PDU" includes a sixth transistor T6, a seventh transistor T7, an eighth transistor T8, and a ninth transistor T9. The gate of the sixth transistor T6 receives the fourth predetermined clock signal PCS4, the drain of the sixth transistor T6 is coupled to the source of the fifth transistor T5, and the source of the sixth transistor T6 is coupled to the reference potential Vss. The gate of the seventh transistor T7 receives the first input scan signal ISS1, the drain of the seventh transistor T7 is coupled to the source of the first transistor T1, and the source of the seventh transistor T7 is coupled to the source of the sixth transistor T6.

The gate of the eighth transistor T8 receives the second input scan signal ISS2, the drain of the eighth transistor T8 is coupled to the source of the first transistor T1, and the source of the eighth transistor T8 is coupled to the source of the sixth transistor T6. The gate of the ninth transistor T9 receives the predetermined activating signal PSS, the drain of the ninth transistor T9 is coupled to the source of the first transistor T1, and the source of the ninth transistor T9 is coupled to the source of the sixth transistor T6.

The differences between the circuit structures of shift registers in different groups have been explained with reference to FIG. 3B, FIG. 4B, and FIG. 5B. Below, in order to describe the operations of the shift register device SRD specifically, the shift register device SRD illustrated in FIG. 4 is simplified into an implementation pattern of N=4, and the operations thereof will be explained with corresponding signals.

Figure 6A:
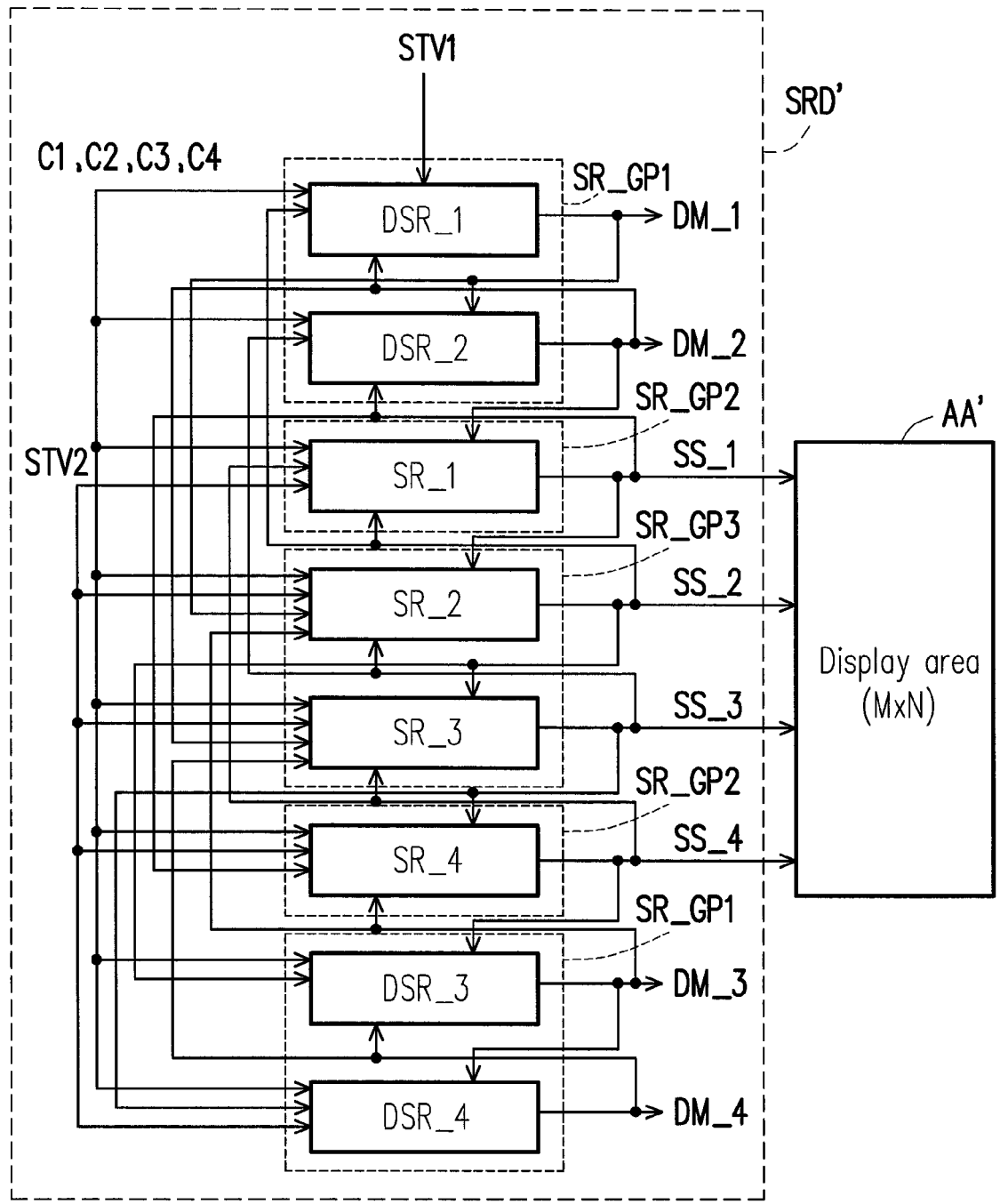
FIG. 6A is a diagram illustrating how the simplified shift register device in FIG. 2 generates scan signals.

FIG. 6A is a diagram illustrating how the simplified shift register device in FIG. 2 generates scan signals. In the present embodiment, the shift register device SRD' includes serially connected shift registers DSR_1, DSR_2, SR_1-SR_4, DSR_3, and DSR_4. With the disposition of the shift registers illustrated in FIG. 6A and by applying appropriate operating signals to each of the shift registers, the shift register device SRD' can be configured to realize a forward scanning pixel activation mechanism and a reverse scanning pixel activation mechanism.

FIGS. 6B-6I are diagrams of corresponding circuit structures of each shift register and the received signals according to the embodiment illustrated in FIG. 6A. Each of the shift registers DSR_1-DSR_4 in the first group SR_GP1 has the circuit structure of shift registers in the first group SR_GP1 illustrated in FIG. 3B, and the signals respectively received by the shift registers DSR_1-DSR_4 will be described below.

Figure 6B:
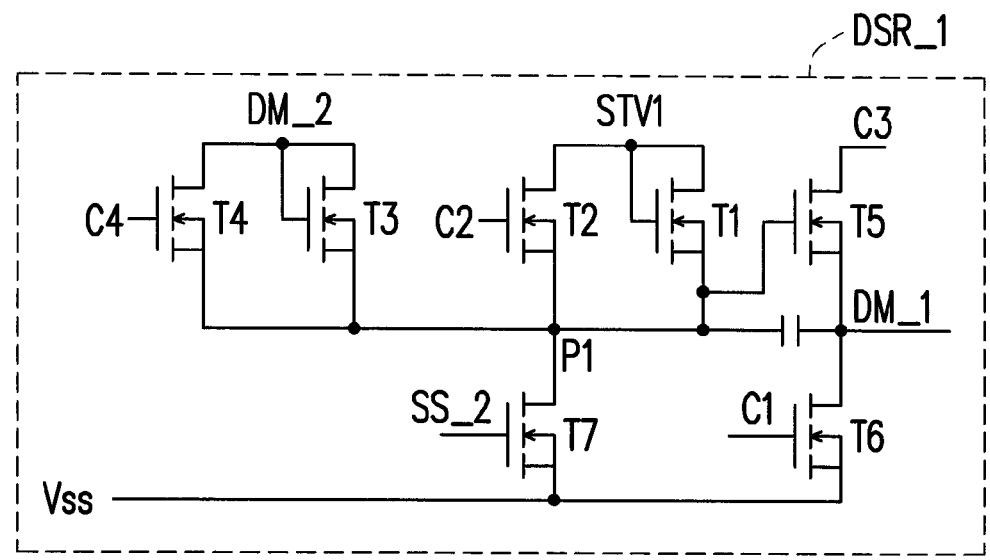
FIGS. 6B-6I are diagrams of corresponding circuit structures of each shift register and the received signals according to the embodiment illustrated in FIG. 6A.

Referring to FIG. 6B, in the shift register DSR_1, the first predetermined input signal PIS1 is an activating signal STV1, the first predetermined clock signal PCS 1 is a clock signal C2, the second predetermined input signal PIS2 is a dummy scan signal DM_2, the second predetermined clock signal PCS2 is a clock signal C4, the third predetermined clock signal PCS3 is a clock signal C3, the output scan signal OSS is a dummy scan signal DM_1, the fourth predetermined clock signal PCS4 is a clock signal C1, and the input scan signal ISS is a scan driving signal SS_2.

Figure 6C:
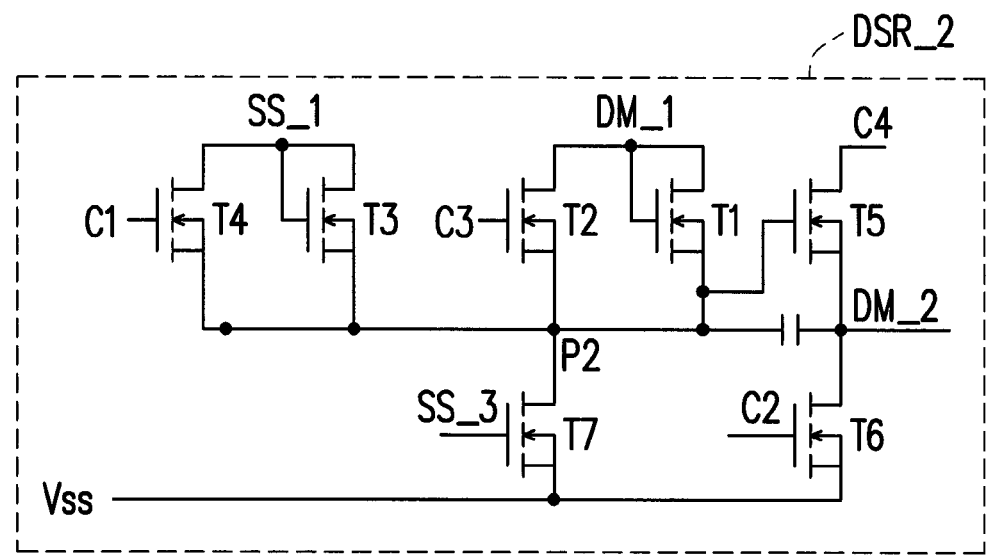

Referring to FIG. 6C, in the shift register DSR_2, the first predetermined input signal PIS1 is the dummy scan signal DM_1, the first predetermined clock signal PCS1 is the clock signal C3, the second predetermined input signal PIS2 is a scan driving signal SS_1, the second predetermined clock signal PCS2 is the clock signal C1, the third predetermined clock signal PCS3 is the clock signal C4, the output scan signal OSS is the dummy scan signal DM_2, the fourth predetermined clock signal PCS4 is the clock signal C2, and the input scan signal ISS is a scan driving signal SS_3.

Figure 6D:
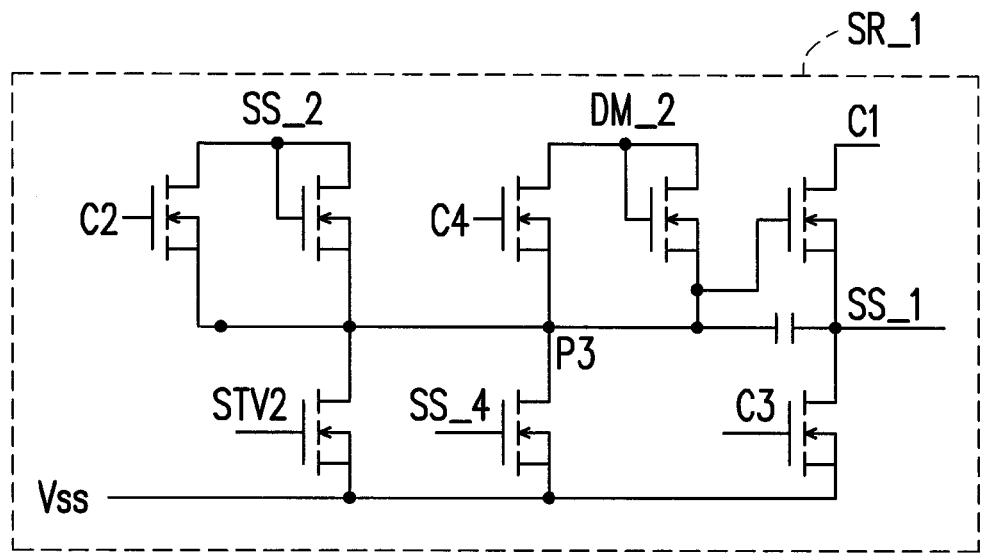
Figure 6E:
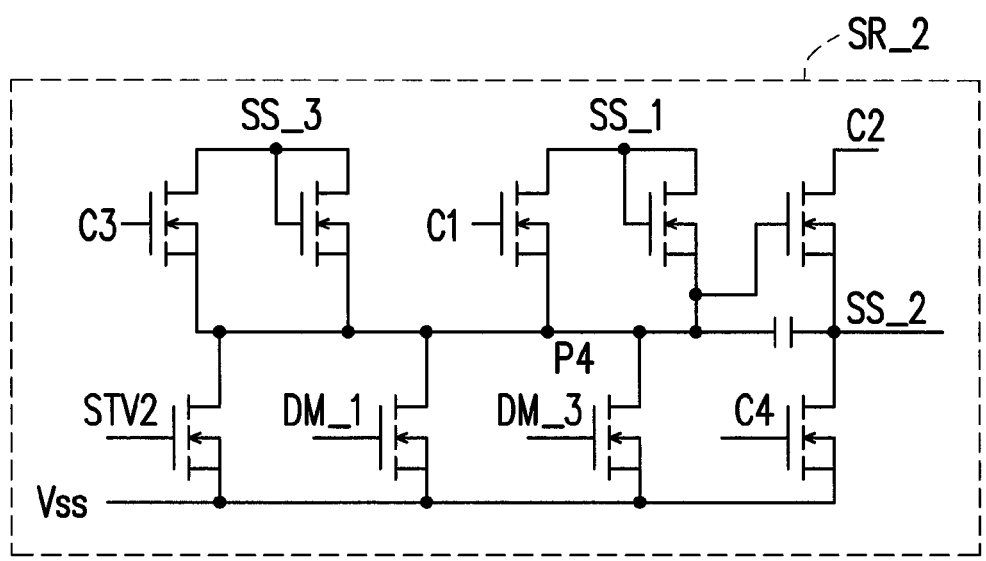
Figure 6F:
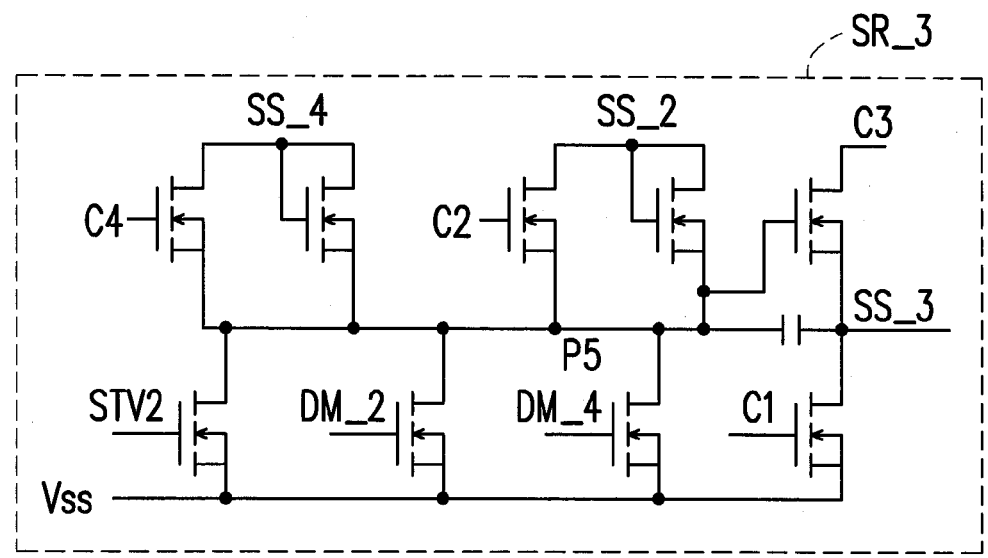
Figure 6G:
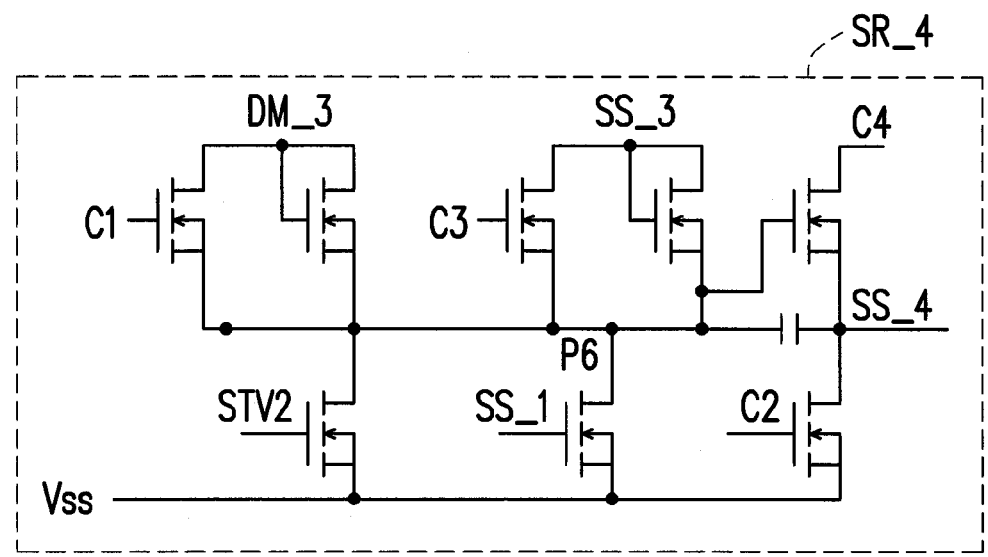
Figure 6H:
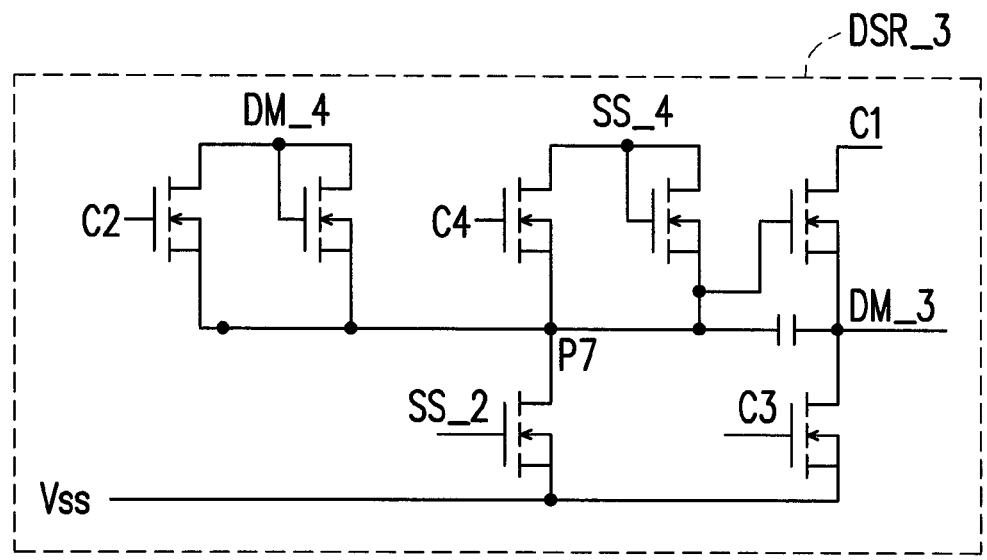

Referring to FIG. 6H, in the shift register DSR_3, the first predetermined input signal PIS 1 is a scan signal SS_4, the first predetermined clock signal PCS 1 is the clock signal C4, the second predetermined input signal PIS2 is a dummy scan signal DM_4, the second predetermined clock signal PCS2 is the clock signal C2, the third predetermined clock signal PCS3 is the clock signal C1, the output scan signal OSS is a dummy scan signal DM_3, the fourth predetermined clock signal PCS4 is the clock signal C3, and the input scan signal ISS is the scan driving signal SS_2.

Figure 6I:
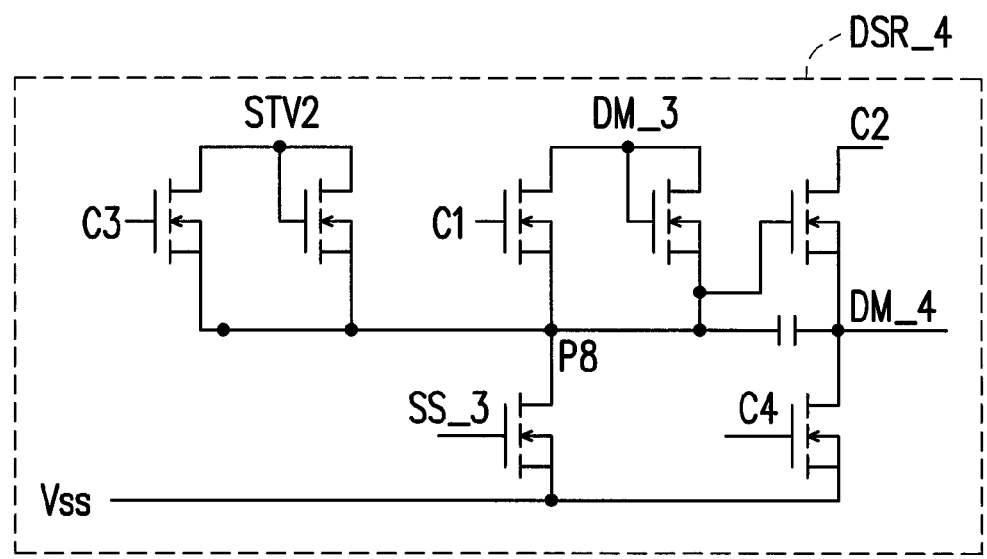

Referring to FIG. 6I, in the shift register DSR_4, the first predetermined input signal PIS1 is the dummy scan signal DM_3, the first predetermined clock signal PCS1 is the clock signal C1, the second predetermined input signal PIS2 is an activating signal STV2, the second predetermined clock signal PCS2 is the clock signal C3, the third predetermined clock signal PCS3 is the clock signal C2, the output scan signal OSS is the dummy scan signal DM_4, the fourth predetermined clock signal PCS4 is the clock signal C4, and the input scan signal ISS is the scan driving signal SS_3.

Each of the shift registers SR_1 and SR_4 in the second group SR_GP2 has the circuit structure of shift registers in the second group SR_GP2 illustrated in FIG. 4B, and the signals respectively received by the shift registers SR_1 and SR_4 will be described below.

Referring to FIG. 6D, in the shift register SR_1, the first predetermined input signal PIS1 is the dummy scan signal DM_2, the first predetermined clock signal PCS1 is the clock signal C4, the second predetermined input signal PIS2 is the scan driving signal SS_2, the second predetermined clock signal PCS2 is the clock signal C2, the third predetermined clock signal PCS3 is the clock signal C1, the output scan signal OSS is the scan driving signal SS_1, the fourth predetermined clock signal PCS4 is the clock signal C3, the input scan signal ISS is a scan driving signal SS_4, and the predetermined activating signal PSS is the activating signal STV2.

Referring to FIG. 6G, in the shift register SR_4, the first predetermined input signal PIS1 is the scan driving signal SS_3, the first predetermined clock signal PCS1 is the clock signal C3, the second predetermined input signal PIS2 is the dummy scan signal DM_3, the second predetermined clock signal PCS2 is the clock signal C1, the third predetermined clock signal PCS3 is the clock signal C4, the output scan signal OSS is the scan driving signal SS_4, the fourth predetermined clock signal PCS4 is the clock signal C2, the input scan signal ISS is the scan driving signal SS_1, and the predetermined activating signal PSS is the activating signal STV2.

Each of the shift registers SR_2 and SR_3 in the third group SR_GP3 has the circuit structure of shift registers in the third group SR_GP3 illustrated in FIG. 5B, and the signals respectively received by the shift registers SR_2 and SR_3 will be described below.

Referring to FIG. 6E, in the shift register SR_2, the first predetermined input signal PIS1 is the scan driving signal SS_1, the first predetermined clock signal PCS1 is the clock signal C1, the second predetermined input signal PIS2 is the scan driving signal SS_3, the second predetermined clock signal PCS2 is the clock signal C3, the third predetermined clock signal PCS3 is the clock signal C2, the output scan signal OSS is the scan driving signal SS_2, the fourth predetermined clock signal PCS4 is the clock signal C4, the first input scan signal ISS1 is the dummy scan signal DM_3, the second input scan signal ISS2 is the dummy scan signal DM_1, and the predetermined activating signal PSS is the activating signal STV2.

Referring to FIG. 6F, in the shift register SR_3, the first predetermined input signal PIS1 is the scan driving signal SS_2, the first predetermined clock signal PCS1 is the clock signal C2, the second predetermined input signal PIS2 is the scan driving signal SS_4, the second predetermined clock signal PCS2 is the clock signal C4, the third predetermined clock signal PCS3 is the clock signal C3, the output scan signal OSS is the scan driving signal SS_3, the fourth predetermined clock signal PCS4 is the clock signal C1, the first input scan signal ISS1 is the dummy scan signal DM_4, the second input scan signal ISS2 is the dummy scan signal DM_2, and the predetermined activating signal PSS is the activating signal STV2.

Referring to FIG. 6A again, in the forward scanning mechanism, triggered by the first activating signal STV1, the shift register device sequentially outputs the dummy scan signals DM_1 and DM_2 through the shift registers DSR_1 and DSR_2 in the first group SR_GP1 and then the scan driving signal SS_1 through the shift register SR_1 in the second group SR_GP2 to activate the first row of pixels within the display area AA'. After that, the shift registers SR_2 and SR_3 in the third group SR_GP3 sequentially output the scan driving signals SS_2 and SS_3 to respectively activate the second row of pixels and the third row of pixels within the display area AA'. Next, the shift register SR_4 in the second group SR_GP2 outputs the scan driving signal SS_4 to activate the fourth row (i.e., the last row) of pixels within the display area AA'. Thereafter, the shift registers DSR_3 and DSR_4 in the first group SR_GP1 output the dummy scan signals DM_3 and DM_4.

On the other hand, in the reverse scanning mechanism, triggered by the second activating signal STV2, the shift register device SRD' sequentially outputs the dummy scan signals DM_4 and DM_3, the scan driving signals SS_4-SS_1, and the dummy scan signals DM_2 and DM_1 through the shift registers DSR_4, DSR_3, SR_4-SR_1, DSR_2, and DSR_1.

Figure 7A:
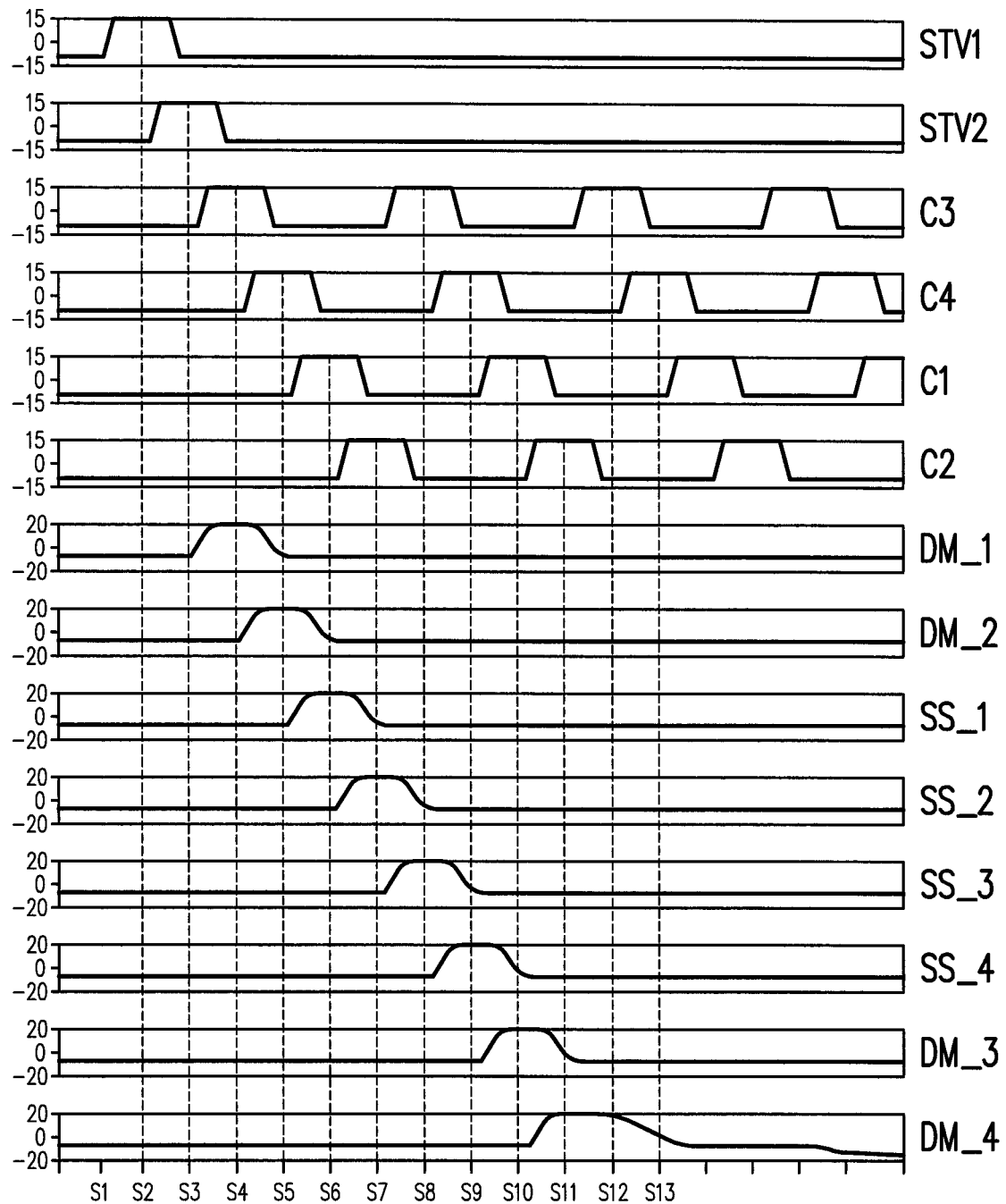
FIG. 7A illustrates signal waveforms when a forward scanning mechanism is realized in the embodiment illustrated in FIGS. 6B-6I.

FIG. 7A illustrates signal waveforms when the forward scanning mechanism is realized in the embodiment illustrated in FIGS. 6B-6I. In the present embodiment, the shift registers DSR_1-DSR_4 and SR_1-SR_4 generate corresponding scan signals at different time points in response to the activating signals STV1 and STV2 and the clock signals C1-C4. Herein the enabling time of the activating signals STV1 and STV2 and every two of the clock signals C3, C4, C1, and C2 overlap each other for 50% of a duty cycle. For example, the duty cycle of the activating signal STV1 is between the time points S1 and S3, and the duty cycle of the activating signal STV2 is between the time points S2 and S4. Thus, the overlapped enabling time of the activating signals STV1 and STV2 is between the time points S2 and S3 (i.e., 50% of the duty cycle of each of the activating signals STV1 and STV2). Or, the duty cycle of the clock signal C3 is between the time points S3 and S5, and the duty cycle of the clock signal C4 is between the time points S4 and S6. Thus, the overlapped enabling time of the clock signals C3 and C4 is between the time points S4 and S5 (i.e., 50% of the duty cycle of each of the clock signals C3 and C4).

Referring to FIG. 6B and FIG. 7A, regarding the shift register DSR_1, at time point S1, since the activating signal STV1 is enabled, the first transistor T1 is turned on, such that the node P1 is pre-charged. When the node P1 reaches a high voltage level, the fifth transistor T5 is turned on and the clock signal C3 is outputted between the time points S3 and S5. Accordingly, the dummy scan signal DM_1 is generated. After that, after time point S5, the sixth transistor T6 is turned on/off by the clock signal C1 so that the dummy scan signal DM_1 is pulled down to the reference potential Vss. Besides, between the time points S6 and S8, the voltage level on the node P1 is pulled-down to the reference potential Vss by enabling the scan driving signal SS_2.

Referring to FIG. 6C and FIG. 7A, regarding the shift register DSR_2, when the shift register DSR_1 in FIG. 6B generates the dummy scan signal DM_1 at time point S3, the first transistor T1 of the shift register DSR_2 is turned on and the node P2 is pre-charged. When the node P2 reaches a high voltage level, the fifth transistor T5 is turned on, and the clock signal C4 is outputted between the time points S4 and S6. Accordingly, the dummy scan signal DM_2 is outputted. After time point S6, the clock signal C2 is enabled, so that the sixth transistor T6 is turned on/off and the dummy scan signal DM_2 is pulled down to the reference potential Vss. Between the time points S7 and S9, the seventh transistor T7 is turned on by the scan driving signal SS_3, such that the voltage level on the node P2 is pulled down to the reference potential Vss.

Referring to FIGS. 6D-6G and FIG. 7A, it should be noted that regarding the second group SR_GP2 (i.e., the shift registers SR_1 and SR_4) and the third group SR_GP3 (i.e., the shift registers SR_2 and SR_3), the enablement of the activating signal STV2 between the time points S2 and S4 makes the voltage levels on the nodes P3-P6 be pulled down to the reference potential Vss, hence the scan driving signals SS_1-SS_4 would not be outputted. In other words, the enabled activating signal STV2 between the time points S2 and S4 prevents the shift registers SR_1-SR4 from outputting the scan driving signals SS_1-SS_4.

Referring to FIG. 6D and FIG. 7A, at time point S4, the dummy scan signal DM_2 is enabled so that the node P3 is pre-charged. Besides, at time point S5, since the clock signal C1 is enabled, the scan driving signal SS_1 is generated, such that the first row of pixels within the display area AA' are activated. After time point S7, the clock signal C3 is enabled so that the scan driving signal SS_1 is pulled down to the reference potential Vss. Besides, between time points S8 and S10, the scan driving signal SS_4 is enabled so that the voltage level on the node P3 is pulled down to the reference potential Vss.

Referring to FIG. 6E and FIG. 7A, at time point S5, the scan driving signal SS_1 is enabled so that the node P4 is pre-charged. Besides, at time point S6, since the clock signal C2 is enabled, the scan driving signal SS_2 is generated, such that the second row of pixels within the display area AA' are activated. Because the clock signal C4 is enabled, the scan driving signal SS_2 is pulled down to the reference potential Vss. Besides, between the time points S9 and S11, the dummy scan signal DM_3 is enabled so that the voltage level on the node P4 is pulled down to the reference potential Vss.

Referring to FIG. 6F and FIG. 7A, at time point S6, the scan driving signal SS_2 is enabled so that the node P5 is pre-charged. Besides, between time points S7 and S9, since the clock signal C3 is enabled, the scan driving signal SS_3 is generated, such that the third row of pixels within the display area AA' are activated. Because the clock signal C1 is enabled, the scan driving signal SS_3 is pulled down to the reference potential Vss. Besides, between time points S10 and S12, the dummy scan signal DM_4 is enabled so that the voltage level on the node P4 is pulled down to the reference potential Vss.

Referring to FIG. 6G and FIG. 7A, at time point S7, the scan driving signal SS_3 is enabled so that the node P6 is pre-charged. Besides, the enabled clock signal C4 between time points S8 and S10 makes the scan driving signal SS_4 be generated, and hence the fourth row of pixels within the display area AA' are activated. Because the clock signal C2 is enabled, the scan driving signal SS_4 is pulled down to the reference potential Vss.

Referring to FIG. 6H and FIG. 7A, at time point S8, the scan driving signal SS_4 is enabled so that the node P7 is pre-charged. Besides, between time points S9 and S11, the clock signal C1 is enabled so that the dummy scan signal DM_3 is generated. Because the clock signal C3 is enabled, the dummy scan signal DM_3 is pulled down to the reference potential Vss.

Referring to FIG. 6I and FIG. 7A, at time point S9, the dummy scan signal DM_3 is enabled so that the node P8 is pre-charged. Besides, between time points S10 and S12, the clock signal C2 is enabled and accordingly the dummy scan signal DM_4 is generated. Because the clock signal C4 is enabled, the dummy scan signal DM_4 is pulled down to the reference potential Vss.

How the shift register device SRD' forwardly and sequentially generates the dummy scan signals (DM_1, DM_2), the scan driving signals SS_1-SS_4, and the dummy scan signals (DM_3, DM_4) in response to the activating signals STV1 and STV2 and the clock signals C4, C3, C1, and C2 can be well understood based on foregoing descriptions.

Figure 7B:
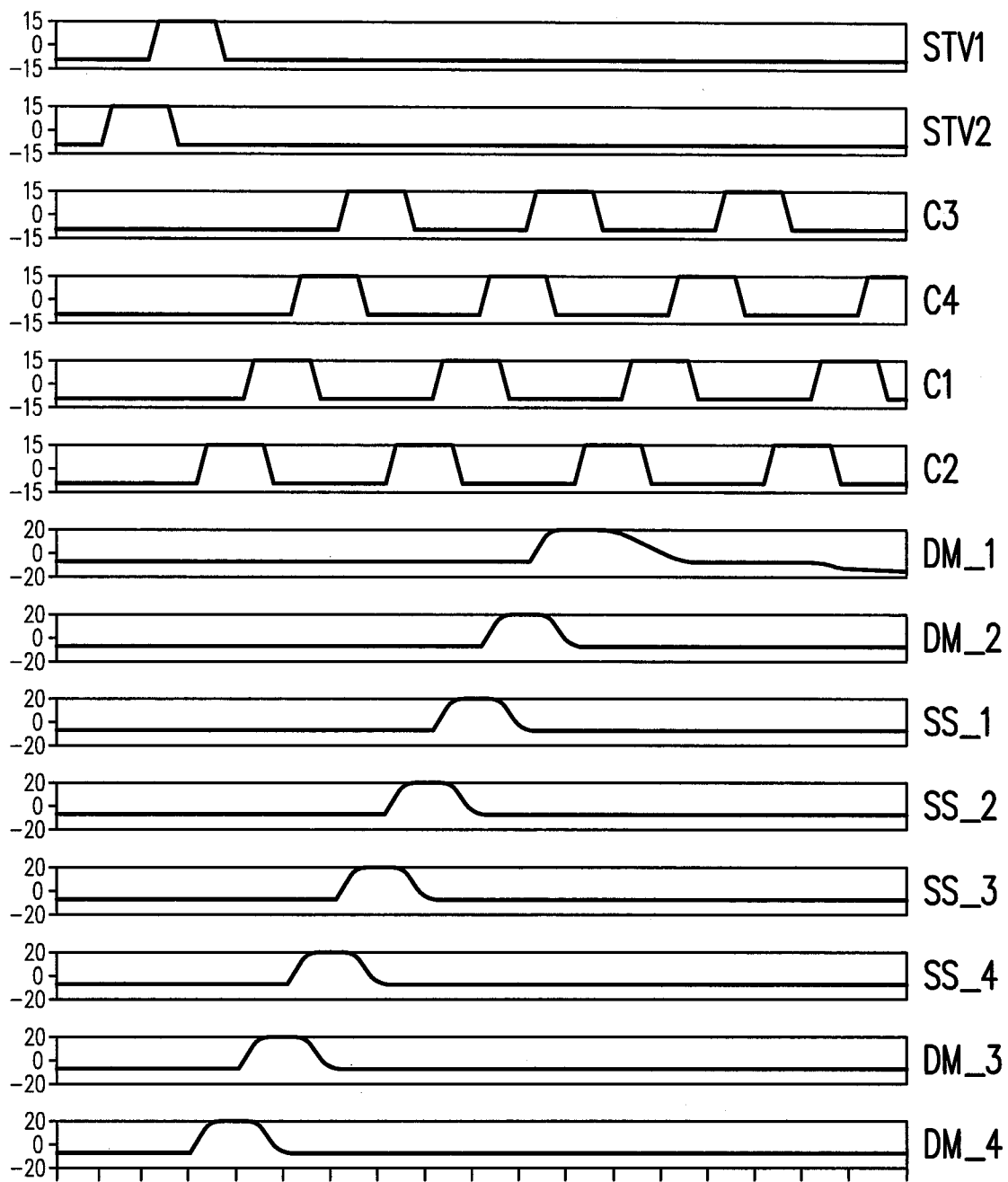
FIG. 7B illustrates signal waveforms when a reverse scanning mechanism is realized in the embodiment illustrated in FIGS. 6B-6I.

FIG. 7B illustrates signal waveforms when a reverse scanning mechanism is realized in the embodiment illustrated in FIGS. 6B-6I. By referring to above descriptions related to FIGS. 6A-6I and 7A, how the reverse scanning mechanism works should be understood by those skilled in the art based on how the shift register device SRD' reversely and sequentially generates the dummy scan signals DM_4 and DM_3, the scan driving signals SS_4-SS_1, and the dummy scan signals DM_2 and DM_1 in response to the activating signals STV1 and STV2 and the clock signals C4, C3, C1, and C2 in FIG. 7B therefore will not be described herein.

In addition, even though N=4 is assumed in the embodiment illustrated in FIG. 6A, in other embodiments, the number of pixel rows within the display area AA' can be increased by implementing the shift registers for driving the second to the second last row of pixels with a plurality of shift registers belonging to the second group SR_GP2. In other words, the circuit of the shift register device is duplicated by using shift registers belonging to the second group SR_GP2. In other embodiments, the shift registers in each exemplary embodiment described above may also be disposed at both sides of the display panel.

Thereby, regardless of whether the shift register device SRD performs forward scanning or reverse scanning on the display area AA in response to the activating signals STV1 and STV2 and the clock signals C1-C4 provided by the T-con 105, all the shift registers (SR_1-SR_N, DSR_1-DSR_4) in the shift register device SRD always forwardly/reversely and sequentially outputs the scan driving signals SS_1-SS_N/SS_N-SS_1 to activate the pixels within the display area AA from the first row to the last row or from the last row to the first row. The source driver 103 provides corresponding display data to the row pixels activated by the shift register device SRD. Thus, an image is displayed on the LCD panel 101 with the help of the (back)light source provided by the backlight module 107.

As described above, the invention provides an LCD and a shift register device thereof. The shift registers in the shift register device are categorized into three groups based on their different circuit structures, and appropriate activating signals and clock signals are applied, so that when pixels within a display area of the LCD are activated, a forward scanning (i.e., form the first row to the last row) pixel activation mode and a reverse scanning (i.e., from the last row to the first row) pixel activation mode can be respectively realized.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A shift register device, comprising:
a plurality of serially connected shift registers, wherein the shift registers sequentially generate a plurality of scan signals,
wherein each of the shift registers comprises a forward pre-charge unit, a reverse pre-charge unit, a pull-up unit, and a pull-down unit, the pull-up unit generates an output scan signal, and the pull-down unit determines whether to pull down the output scan signal to a reference potential,
wherein each of the shift registers generates one of the scan signals according to a predetermined activating signal and a plurality of clock signals,
wherein the shift registers are categorized into a first group, a second group, and a third group,
wherein the pull-down unit in the first group of shift registers and the pull-down unit in the second group of shift registers have different circuit structures,
wherein the pull-down unit in the second group of shift registers and the pull-down unit in the third group of shift registers have different circuit structures,
wherein the pull-down unit in the first group of shift registers and the pull-down unit in the third group of shift registers have different circuit structures.

2. The shift register device according to claim 1, wherein the predetermined activating signal comprises a first activating signal or a second activating signal, the clock signals comprise a first clock signal, a second clock signal, a third clock signal, and a fourth clock signal, the sequentially generated scan signals at least comprise a first dummy scan signal, a second dummy scan signal, a first scan driving signal, a second scan driving signal, a third scan driving signal, a fourth scan driving signal, a third dummy scan signal, and a fourth dummy scan signal, and each of the shift registers in the first group comprises:
the forward pre-charge unit, receiving a first predetermined input signal and a first predetermined clock signal, and generating a forward pre-charge signal according to the first predetermined input signal and the first predetermined clock signal;
the reverse pre-charge unit, coupled to the forward pre-charge unit, receiving a second predetermined input signal and a second predetermined clock signal, and generating a reverse pre-charge signal according to the second predetermined input signal and the second predetermined clock signal;
the pull-up unit, coupled to the forward pre-charge unit and the reverse pre-charge unit, receiving a third predetermined clock signal and the forward pre-charge signal or the third predetermined clock signal and the reverse pre-charge signal, and generating the output scan signal according to the third predetermined clock signal and the forward pre-charge signal or the third predetermined clock signal and the reverse pre-charge signal; and
the pull-down unit, coupled to the forward pre-charge unit, the reverse pre-charge unit, and the pull-up unit, receiving a fourth predetermined clock signal and an input scan signal, and determining whether to pull down the output scan signal to the reference potential according to the fourth predetermined clock signal and the input scan signal,
wherein the forward pre-charge unit comprises:
a first transistor, having a drain and a gate coupled together for receiving the first predetermined input signal; and
a second transistor, having a gate for receiving the first predetermined clock signal, a drain coupled to the drain of the first transistor, and a source coupled to a source of the first transistor,
wherein the reverse pre-charge unit comprises:
a third transistor, having a drain and a gate coupled together for receiving the second predetermined input signal and a source coupled to the source of the second transistor; and
a fourth transistor, having a gate for receiving the second predetermined clock signal, a drain coupled to the drain of the third transistor, and a source coupled to the source of the third transistor, wherein the pull-up unit comprises:
   a fifth transistor, having a gate coupled to the source of the first transistor, a drain for receiving the third predetermined clock signal, and a source for outputting the output scan signal; and
   a capacitor, coupled between the gate and the source of the fifth transistor,
wherein the pull-down unit comprises:
   a sixth transistor, having a gate for receiving the fourth predetermined clock signal, a drain coupled to the source of the fifth transistor, and a source coupled to the reference potential; and
   a seventh transistor, having a gate for receiving the input scan signal, a drain coupled to the source of the first transistor, and a source coupled to the source of the sixth transistor,
wherein all the transistors are N-type transistors.

3. The shift register device according to claim 2, wherein the first predetermined input signal is the first activating signal, the first predetermined clock signal is the second clock signal, the second predetermined input signal is the second dummy scan signal, the second predetermined clock signal is the fourth clock signal, the third predetermined clock signal is the third clock signal, the output scan signal is the first dummy scan signal, the fourth predetermined clock signal is the first clock signal, and the input scan signal is the second scan driving signal.

4. The shift register device according to claim 2, wherein the first predetermined input signal is the first dummy scan signal, the first predetermined clock signal is the third clock signal, the second predetermined input signal is the first scan driving signal, the second predetermined clock signal is the first clock signal, the third predetermined clock signal is the fourth clock signal, the output scan signal is the second dummy scan signal, the fourth predetermined clock signal is the second clock signal, and the input scan signal is the third scan driving signal.

5. The shift register device according to claim 2, wherein the first predetermined input signal is the fourth scan driving signal, the first predetermined clock signal is the fourth clock signal, the second predetermined input signal is the fourth dummy scan signal, the second predetermined clock signal is the second clock signal, the third predetermined clock signal is the first clock signal, the output scan signal is the third dummy scan signal, the fourth predetermined clock signal is the third clock signal, and the input scan signal is the second scan driving signal.

6. The shift register device according to claim 2, wherein the first predetermined input signal is the third dummy scan signal, the first predetermined clock signal is the first clock signal, the second predetermined input signal is the second activating signal, the second predetermined clock signal is the third clock signal, the third predetermined clock signal is the second clock signal, the output scan signal is the fourth dummy scan signal, the fourth predetermined clock signal is the fourth clock signal, and the input scan signal is the third scan driving signal.

7. The shift register device according to claim 1, wherein the predetermined activating signal comprises a first activating signal or a second activating signal, the clock signals comprise a first clock signal, a second clock signal, a third clock signal, and a fourth clock signal, the sequentially generated scan signals at least comprise a first dummy scan signal, a second dummy scan signal, a first scan driving signal, a second scan driving signal, a third scan driving signal, a fourth scan driving signal, a third dummy scan signal, and a fourth dummy scan signal, and each of the shift registers in the second group comprises:

the forward pre-charge unit, receiving a first predetermined input signal and a first predetermined clock signal, and generating a forward pre-charge signal according to the first predetermined input signal and the first predetermined clock signal;

the reverse pre-charge unit, coupled to the forward pre-charge unit, receiving a second predetermined input signal and a second predetermined clock signal, and generating a reverse pre-charge signal according to the second predetermined input signal and the second predetermined clock signal;

the pull-up unit, coupled to the forward pre-charge unit and the reverse pre-charge unit, receiving a third predetermined clock signal and the forward pre-charge signal or the third predetermined clock signal and the reverse pre-charge signal, and generating the output scan signal according to the third predetermined clock signal and the forward pre-charge signal or the third predetermined clock signal and the reverse pre-charge signal; and the pull-down unit, coupled to the forward pre-charge unit, the reverse pre-charge unit, and the pull-up unit, receiving a fourth predetermined clock signal, an input scan signal, and a predetermined activating signal, and determining whether to pull down the output scan signal to the reference potential according to the fourth predetermined clock signal, the input scan signal, and the predetermined activating signal, wherein the forward pre-charge unit comprises:
   a first transistor, having a drain and a gate coupled together for receiving the first predetermined input signal; and
   a second transistor, having a gate for receiving the first predetermined clock signal, a drain coupled to the drain of the first transistor, and a source coupled to a source of the first transistor, wherein the reverse pre-charge unit comprises:
   a third transistor, having a drain and a gate coupled together for receiving the second predetermined input signal and a source coupled to the source of the second transistor; and
   a fourth transistor, having a gate for receiving the second predetermined clock signal, a drain coupled to the drain of the third transistor, and a source coupled to the source of the third transistor, wherein the pull-up unit comprises:
   a fifth transistor, having a gate coupled to the source of the first transistor, a drain for receiving the third predetermined clock signal, and a source for outputting the output scan signal; and
   a capacitor, coupled between the gate and the source of the fifth transistor, wherein the pull-down unit comprises:
   a sixth transistor, having a gate for receiving the fourth predetermined clock signal, a drain coupled to the source of the fifth transistor, and a source coupled to the reference potential;
   a seventh transistor, having a gate for receiving the input scan signal, a drain coupled to the source of the first transistor, and a source coupled to the source of the sixth transistor; and
   an eighth transistor, having a gate for receiving a predetermined activating signal, a drain coupled to the source of the first transistor, and a source coupled to the source of the sixth transistor, wherein all the transistors are N-type transistors.

8. The shift register device according to claim 7, wherein the first predetermined input signal is the second dummy scan signal, the first predetermined clock signal is the fourth clock signal, the second predetermined input signal is the second scan driving signal, the second predetermined clock signal is the second clock signal, the third predetermined clock signal is the first clock signal, the output scan signal is the first scan driving signal, the fourth predetermined clock signal is the third clock signal, the input scan signal is the fourth scan driving signal, and the predetermined activating signal is the second activating signal.

9. The shift register device according to claim 7, wherein the first predetermined input signal is the third scan driving signal, the first predetermined clock signal is the third clock signal, the second predetermined input signal is the third dummy scan signal, the second predetermined clock signal is the first clock signal, the third predetermined clock signal is the fourth clock signal, the output scan signal is the fourth scan driving signal, the fourth predetermined clock signal is the second clock signal, the input scan signal is the first scan driving signal, and the predetermined activating signal is the second activating signal.

10. The shift register device according to claim 1, wherein the predetermined activating signal comprises a first activating signal or a second activating signal, the clock signals comprise a first clock signal, a second clock signal, a third clock signal, and a fourth clock signal, the sequentially generated scan signals at least comprise a first dummy scan signal, a second dummy scan signal, a first scan driving signal, a second scan driving signal, a third scan driving signal, a fourth scan driving signal, a third dummy scan signal, and a fourth dummy scan signal, and each of the shift registers in the third group comprises:
the forward pre-charge unit, receiving a first predetermined input signal and a first predetermined clock signal, and generating a forward pre-charge signal according to the first predetermined input signal and the first predetermined clock signal;
the reverse pre-charge unit, coupled to the forward pre-charge unit, receiving a second predetermined input signal and a second predetermined clock signal, and generating a reverse pre-charge signal according to the second predetermined input signal and the second predetermined clock signal;
the pull-up unit, coupled to the forward pre-charge unit and the reverse pre-charge unit, receiving a third predetermined clock signal and the forward pre-charge signal or the third predetermined clock signal and the reverse pre-charge signal, and generating the output scan signal according to the third predetermined clock signal and the forward pre-charge signal or the third predetermined clock signal and the reverse pre-charge signal; and
the pull-down unit, coupled to the forward pre-charge unit, the reverse pre-charge unit, and the pull-up unit, receiving a fourth predetermined clock signal, a first input scan signal, a second input scan signal, and a predetermined activating signal, and determining whether to pull down the output scan signal to the reference potential according to the fourth predetermined clock signal, the first input scan signal, the second input scan signal, and the predetermined activating signal,
wherein the forward pre-charge unit comprises:
a first transistor, having a drain and a gate coupled together for receiving the first predetermined input signal; and
a second transistor, having a gate for receiving the first predetermined clock signal, a drain coupled to the drain of the first transistor, and a source coupled to a source of the first transistor,
wherein the reverse pre-charge unit comprises:
a third transistor, having a drain and a gate coupled together for receiving the second predetermined input signal and a source coupled to the source of the second transistor; and
a fourth transistor, having a gate for receiving the second predetermined clock signal, a drain coupled to the drain of the third transistor, and a source coupled to the source of the third transistor,
wherein the pull-up unit comprises:
a fifth transistor, having a gate coupled to the source of the first transistor, a drain for receiving the third predetermined clock signal, and a source for outputting the output scan signal; and
a capacitor, coupled between the gate and the source of the fifth transistor,
wherein the pull-down unit comprises:
a sixth transistor, having a gate for receiving the fourth predetermined clock signal, a drain coupled to the source of the fifth transistor, and a source coupled to the reference potential;
a seventh transistor, having a gate for receiving the first input scan signal, a drain coupled to the source of the first transistor, and a source coupled to the source of the sixth transistor;
an eighth transistor, having a gate for receiving the second input scan signal, a drain coupled to the source of the first transistor, and a source coupled to the source of the sixth transistor; and
a ninth transistor, having a gate for receiving the predetermined activating signal, a drain coupled to the source of the first transistor, and a source coupled to the source of the sixth transistor,
wherein all the transistors are N-type transistors.

11. The shift register device according to claim 10, wherein the first predetermined input signal is the first scan driving signal, the first predetermined clock signal is the first clock signal, the second predetermined input signal is the third scan driving signal, the second predetermined clock signal is the third clock signal, the third predetermined clock signal is the second clock signal, the output scan signal is the second scan driving signal, the fourth predetermined clock signal is the fourth clock signal, the first input scan signal is the third dummy scan signal, the second input scan signal is the first dummy scan signal, and the predetermined activating signal is the second activating signal.

12. The shift register device according to claim 10, wherein the first predetermined input signal is the second scan driving signal, the first predetermined clock signal is the second clock signal, the second predetermined input signal is the fourth scan driving signal, the second predetermined clock signal is the fourth clock signal, the third predetermined clock signal is the third clock signal, the output scan signal is the third scan driving signal, the fourth predetermined clock signal is the first clock signal, the first input scan signal is the fourth dummy scan signal, the second input scan signal is the second dummy scan signal, and the predetermined activating signal is the second activating signal.

13. A liquid crystal display (LCD), comprising:
an LCD panel, comprising a substrate and a shift register device; and
a backlight module, providing a backlight source for the LCD panel, wherein the shift register device is directly disposed on the substrate and has a plurality of serially connected shift registers for sequentially generating a plurality of scan signals, wherein each of the shift registers comprises a forward pre-charge unit, a reverse pre-charge unit, a pull-up unit, and a pull-down unit, the pull-up unit generates an output scan signal, and the pull-down unit determines whether to pull down the output scan signal to a reference potential, wherein each of the shift registers generates one of the scan signals according to a predetermined activating signal and a plurality of clock signals, wherein the shift registers are categorized into a first group, a second group, and a third group, wherein the pull-down unit in the first group of shift registers and the pull-down unit in the second group of shift registers have different circuit structures, wherein the pull-down unit in the second group of shift registers and the pull-down unit in the third group of shift registers have different circuit structures, wherein the pull-down unit in the first group of shift registers and the pull-down unit in the third group of shift registers have different circuit structures.

14. The LCD according to claim 13, wherein the predetermined activating signal comprises a first activating signal or a second activating signal, the clock signals comprise a first clock signal, a second clock signal, a third clock signal, and a fourth clock signal, the sequentially generated scan signals at least comprise a first dummy scan signal, a second dummy scan signal, a first scan driving signal, a second scan driving signal, a third scan driving signal, a fourth scan driving signal, a third dummy scan signal, and a fourth dummy scan signal, and each of the shift registers in the first group comprises:

the forward pre-charge unit, receiving a first predetermined input signal and a first predetermined clock signal, and generating a forward pre-charge signal according to the first predetermined input signal and the first predetermined clock signal;

the reverse pre-charge unit, coupled to the forward pre-charge unit, receiving a second predetermined input signal and a second predetermined clock signal, and generating a reverse pre-charge signal according to the second predetermined input signal and the second predetermined clock signal;

the pull-up unit, coupled to the forward pre-charge unit and the reverse pre-charge unit, receiving a third predetermined clock signal and the forward pre-charge signal or the third predetermined clock signal and the reverse pre-charge signal, and generating the output scan signal according to the third predetermined clock signal and the forward pre-charge signal or the third predetermined clock signal and the reverse pre-charge signal; and the pull-down unit, coupled to the forward pre-charge unit, the reverse pre-charge unit, and the pull-up unit, receiving a fourth predetermined clock signal and an input scan signal, and determining whether to pull down the output scan signal to the reference potential according to the fourth predetermined clock signal and the input scan signal;

wherein the forward pre-charge unit comprises:
a first transistor, having a drain and a gate coupled together for receiving the first predetermined input signal; and
a second transistor, having a gate for receiving the first predetermined clock signal, a drain coupled to the drain of the first transistor, and a source coupled to a source of the first transistor, wherein the reverse pre-charge unit comprises:
a third transistor, having a drain and a gate coupled together for receiving the second predetermined input signal and a source coupled to the source of the second transistor;
a fourth transistor, having a gate for receiving the second predetermined clock signal, a drain coupled to the drain of the third transistor, and a source coupled to the source of the third transistor, wherein the pull-up unit comprises:
a fifth transistor, having a gate coupled to the source of the first transistor, a drain for receiving the third predetermined clock signal, and a source for outputting the output scan signal;
a capacitor, coupled between the gate and the source of the fifth transistor, wherein the pull-down unit comprises:
a sixth transistor, having a gate for receiving the fourth predetermined clock signal, a drain coupled to the source of the fifth transistor, and a source coupled to the reference potential; and
a seventh transistor, having a gate for receiving the output scan signal, a drain coupled to the source of the first transistor, and a source coupled to the source of the sixth transistor, wherein all the transistors are N-type transistors.

15. The LCD according to claim 14, wherein:
the first predetermined input signal is either the first activating signal, the first predetermined clock signal is the second clock signal, the second predetermined input signal is the second dummy scan signal, the second predetermined clock signal is the fourth clock signal, the third predetermined clock signal is the third clock signal, the output scan signal is the first dummy scan signal, the fourth predetermined clock signal is the first clock signal, and the input scan signal is the second scan driving signal;

the first predetermined input signal is the first dummy scan signal, the first predetermined clock signal is the third clock signal, the second predetermined input signal is the first scan driving signal, the second predetermined clock signal is the first clock signal, the third predetermined clock signal is the fourth clock signal, the output scan signal is the second dummy scan signal, the fourth predetermined clock signal is the second clock signal, and the input scan signal is the third scan driving signal;

the first predetermined input signal is the fourth scan driving signal, the first predetermined clock signal is the fourth clock signal, the second predetermined input signal is the fourth dummy scan signal, the second predetermined clock signal is the second clock signal, the third predetermined clock signal is the first clock signal, the output scan signal is the third dummy scan signal, the fourth predetermined clock signal is the third clock signal, and the input scan signal is the second scan driving signal; or the first predetermined input signal is the third dummy scan signal, the first predetermined clock signal is the first clock signal, the second predetermined input signal is the second activating signal, the second predetermined clock signal is the third clock signal, the third predetermined clock signal is the second clock signal, the output scan signal is the fourth dummy scan signal, the fourth predetermined clock signal is the fourth clock signal, and the input scan signal is the third scan driving signal.

16. The LCD according to claim 13, wherein the predetermined activating signal comprises a first activating signal or a second activating signal, the clock signals comprise a first clock signal, a second clock signal, a third clock signal, and a fourth clock signal, the sequentially generated scan signals at least comprise a first dummy scan signal, a second dummy scan signal, a first scan driving signal, a second scan driving signal, a third scan driving signal, a fourth scan driving signal, a third dummy scan signal, and a fourth dummy scan signal, and each of the shift registers in the second group comprises:

the forward pre-charge unit, receiving a first predetermined input signal and a first predetermined clock signal, and generating a forward pre-charge signal according to the first predetermined input signal and the first predetermined clock signal;

the reverse pre-charge unit, coupled to the forward pre-charge unit, receiving a second predetermined input signal and a second predetermined clock signal, and generating a reverse pre-charge signal according to the second predetermined input signal and the second predetermined clock signal;

the pull-up unit, coupled to the forward pre-charge unit and the reverse pre-charge unit, receiving a third predetermined clock signal and the forward pre-charge signal or the third predetermined clock signal and the reverse pre-charge signal, and generating the output scan signal according to the third predetermined clock signal and the forward pre-charge signal or the third predetermined clock signal and the reverse pre-charge signal; and the pull-down unit, coupled to the forward pre-charge unit, the reverse pre-charge unit, and the pull-up unit, receiving a fourth predetermined clock signal, an input scan signal, and a predetermined activating signal, and determining whether to pull down the output scan signal to the reference potential according to the fourth predetermined clock signal, the input scan signal, and the predetermined activating signal wherein the forward pre-charge unit comprises:
a first transistor, having a drain and a gate coupled together for receiving the first predetermined input signal; and
a second transistor, having a gate for receiving the first predetermined clock signal, a drain coupled to the drain of the first transistor, and a source coupled to a source of the first transistor, wherein the reverse pre-charge unit comprises:
a third transistor, having a drain and a gate coupled together for receiving the second predetermined input signal and a source coupled to the source of the second transistor; and
a fourth transistor, having a gate for receiving the second predetermined clock signal, a drain coupled to the drain of the third transistor, and a source coupled to the source of the third transistor, wherein the pull-up unit comprises:
a fifth transistor, having a gate coupled to the source of the first transistor, a drain for receiving the third predetermined clock signal, and a source for outputting the output scan signal; and
a capacitor, coupled between the gate and the source of the fifth transistor, wherein the pull-down unit comprises:
a sixth transistor, having a gate for receiving the fourth predetermined clock signal, a drain coupled to the source of the fifth transistor, and a source coupled to the reference potential;

a seventh transistor, having a gate for receiving the input scan signal, a drain coupled to the source of the first transistor, and a source coupled to the source of the sixth transistor;
an eighth transistor, having a gate for receiving a predetermined activating signal, a drain coupled to the source of the first transistor, and a source coupled to the source of the sixth transistor, wherein all the transistors are N-type transistors.

17. The LCD according to claim 16, wherein:
the first predetermined input signal is the second dummy scan signal, the first predetermined clock signal is the fourth clock signal, the second predetermined input signal is the second scan driving signal, the second predetermined clock signal is the second clock signal, the third predetermined clock signal is the first clock signal, the output scan signal is the first scan driving signal, the fourth predetermined clock signal is the third clock signal, the input scan signal is the fourth scan driving signal, and the predetermined activating signal is the second activating signal; or the first predetermined input signal is the third scan driving signal, the first predetermined clock signal is the third clock signal, the second predetermined input signal is the third dummy scan signal, the second predetermined clock signal is the first clock signal, the third predetermined clock signal is the fourth clock signal, the output scan signal is the fourth scan driving signal, the fourth predetermined clock signal is the second clock signal, the input scan signal is the first scan driving signal, and the predetermined activating signal is the second activating signal.

18. The LCD according to claim 13, wherein the predetermined activating signal comprises a first activating signal or a second activating signal, the clock signals comprise a first clock signal, a second clock signal, a third clock signal, and a fourth clock signal, the sequentially generated scan signals at least comprise a first dummy scan signal, a second dummy scan signal, a first scan driving signal, a second scan driving signal, a third scan driving signal, a fourth scan driving signal, a third dummy scan signal, and a fourth dummy scan signal, and each of the shift registers in the third group comprises:

the forward pre-charge unit, receiving a first predetermined input signal and a first predetermined clock signal, and generating a forward pre-charge signal according to the first predetermined input signal and the first predetermined clock signal;

the reverse pre-charge unit, coupled to the forward pre-charge unit, receiving a second predetermined input signal and a second predetermined clock signal, and generating a reverse pre-charge signal according to the second predetermined input signal and the second predetermined clock signal;

the pull-up unit, coupled to the forward pre-charge unit and the reverse pre-charge unit, receiving a third predetermined clock signal and the forward pre-charge signal or the third predetermined clock signal and the reverse pre-charge signal, and generating the output scan signal according to the third predetermined clock signal and the forward pre-charge signal or the third predetermined clock signal and the reverse pre-charge signal; and the pull-down unit, coupled to the forward pre-charge unit, the reverse pre-charge unit, and the pull-up unit, receiving a fourth predetermined clock signal, a first input scan signal, a second input scan signal, and a predetermined activating signal, and determining whether to pull down the output scan signal to the reference potential according to the fourth predetermined clock signal, the first input scan signal, the second input scan signal, and the predetermined activating signal;

wherein the forward pre-charge unit comprises:
  a first transistor, having a drain and a gate coupled together for receiving the first predetermined input signal; and
  a second transistor, having a gate for receiving the first predetermined clock signal, a drain coupled to the drain of the first transistor, and a source coupled to a source of the first transistor, wherein the reverse pre-charge unit comprises:
  a third transistor, having a drain and a gate coupled together for receiving the second predetermined input signal and a source coupled to the source of the second transistor; and
  a fourth transistor, having a gate for receiving the second predetermined clock signal, a drain coupled to the drain of the third transistor, and a source coupled to the source of the third transistor, wherein the pull-up unit comprises:
  a fifth transistor, having a gate coupled to the source of the first transistor, a drain for receiving the third predetermined clock signal, and a source for outputting the output scan signal; and
  a capacitor, coupled between the gate and the source of the fifth transistor, wherein the pull-down unit comprises:
  a sixth transistor, having a gate for receiving the fourth predetermined clock signal, a drain coupled to the source of the fifth transistor, and a source coupled to the reference potential;
  a seventh transistor, having a gate for receiving the first input scan signal, a drain coupled to the source of the first transistor, and a source coupled to the source of the sixth transistor;
  an eighth transistor, having a gate for receiving the second input scan signal, a drain coupled to the source of the first transistor, and a source coupled to the source of the sixth transistor; and
  a ninth transistor, having a gate for receiving the predetermined activating signal, a drain coupled to the source of the first transistor, and a source coupled to the source of the sixth transistor, wherein all the transistors are N-type transistors.

19. The LCD according to claim 18, wherein:
the first predetermined input signal is the first scan driving signal, the first predetermined clock signal is the first clock signal, the second predetermined input signal is the third scan driving signal, the second predetermined clock signal is the third clock signal, the third predetermined clock signal is the second clock signal, the output scan signal is the second scan driving signal, the fourth predetermined clock signal is the fourth clock signal, the first input scan signal is the third dummy scan signal, the second input scan signal is the first dummy scan signal, and the predetermined activating signal is the second activating signal; or the first predetermined input signal is the second scan driving signal, the first predetermined clock signal is the second clock signal, the second predetermined input signal is the fourth scan driving signal, the second predetermined clock signal is the fourth clock signal, the third predetermined clock signal is the third clock signal, the output scan signal is the third scan driving signal, the fourth predetermined clock signal is the first clock signal, the first input scan signal is the fourth dummy scan signal, the second input scan signal is the second dummy scan signal, and the predetermined activating signal is the second activating signal.

* * * * *